US009698094B2

(12) United States Patent
Yanagisawa et al.

(10) Patent No.: US 9,698,094 B2
(45) Date of Patent: Jul. 4, 2017

(54) WIRING BOARD AND ELECTRONIC COMPONENT DEVICE

(71) Applicant: SHINKO ELECTRIC INDUSTRIES CO., LTD., Nagano-shi, Nagano (JP)

(72) Inventors: Hiroharu Yanagisawa, Nagano (JP); Kazuhiro Kobayashi, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 15/228,059

(22) Filed: Aug. 4, 2016

(65) Prior Publication Data

US 2017/0040249 A1 Feb. 9, 2017

(30) Foreign Application Priority Data

Aug. 6, 2015 (JP) .................................. 2015-155697
Jul. 20, 2016 (JP) .................................. 2016-142613

(51) Int. Cl.
*H01L 21/56* (2006.01)
*H01L 23/31* (2006.01)
*H01L 23/498* (2006.01)
*H05K 1/02* (2006.01)
*H01L 21/48* (2006.01)
*H01L 23/00* (2006.01)
*H05K 1/11* (2006.01)
*H05K 1/18* (2006.01)

(52) U.S. Cl.
CPC ...... *H01L 23/49838* (2013.01); *H01L 21/486* (2013.01); *H01L 21/4853* (2013.01); *H01L 21/563* (2013.01); *H01L 23/3178* (2013.01); *H01L 23/49827* (2013.01); *H01L 24/16* (2013.01); *H05K 1/0213* (2013.01); *H05K 1/111* (2013.01); *H05K 1/181* (2013.01); *H01L 2224/16227* (2013.01)

(58) Field of Classification Search
CPC ......... H01L 2224/73204; H01L 23/481; H01L 23/4985; H01L 23/528; H01L 2224/16227; H01L 23/49827; H01L 23/16; H01L 21/4853; H01L 21/563; H01L 23/49838; H01L 23/3178; H01L 2224/0401; H01L 2224/05022; H01L 2224/48228; H01L 2224/73265; H01L 2224/32225; H05K 1/181; H05K 1/111; H05K 1/113
See application file for complete search history.

(56) References Cited

U.S. PATENT DOCUMENTS 8,022,553 B2* 9/2011 Ahn ..................... H01L 23/13
257/773
2011/0101526 A1* 5/2011 Hsiao ................ H01L 23/49816
257/738

FOREIGN PATENT DOCUMENTS

JP 2005-101137 4/2005

* cited by examiner

*Primary Examiner* — Jasmine Clark
(74) *Attorney, Agent, or Firm* — Rankin, Hill & Clark LLP

(57) ABSTRACT

A wiring board includes: an insulating layer; and a wiring layer including: an upper surface; a lower surface opposite to the upper surface; and a side surface between the upper surface and the lower surface, wherein the upper surface of the wiring layer is exposed from the insulating layer, and the side surface and the lower surface of the wiring layer are embedded in the insulating layer. A recess portion is formed in an outer edge portion of the upper surface of the wiring layer, and the recess portion is filled with the insulating layer.

9 Claims, 27 Drawing Sheets

PARTIALLY ENLARGED SECTIONAL VIEW

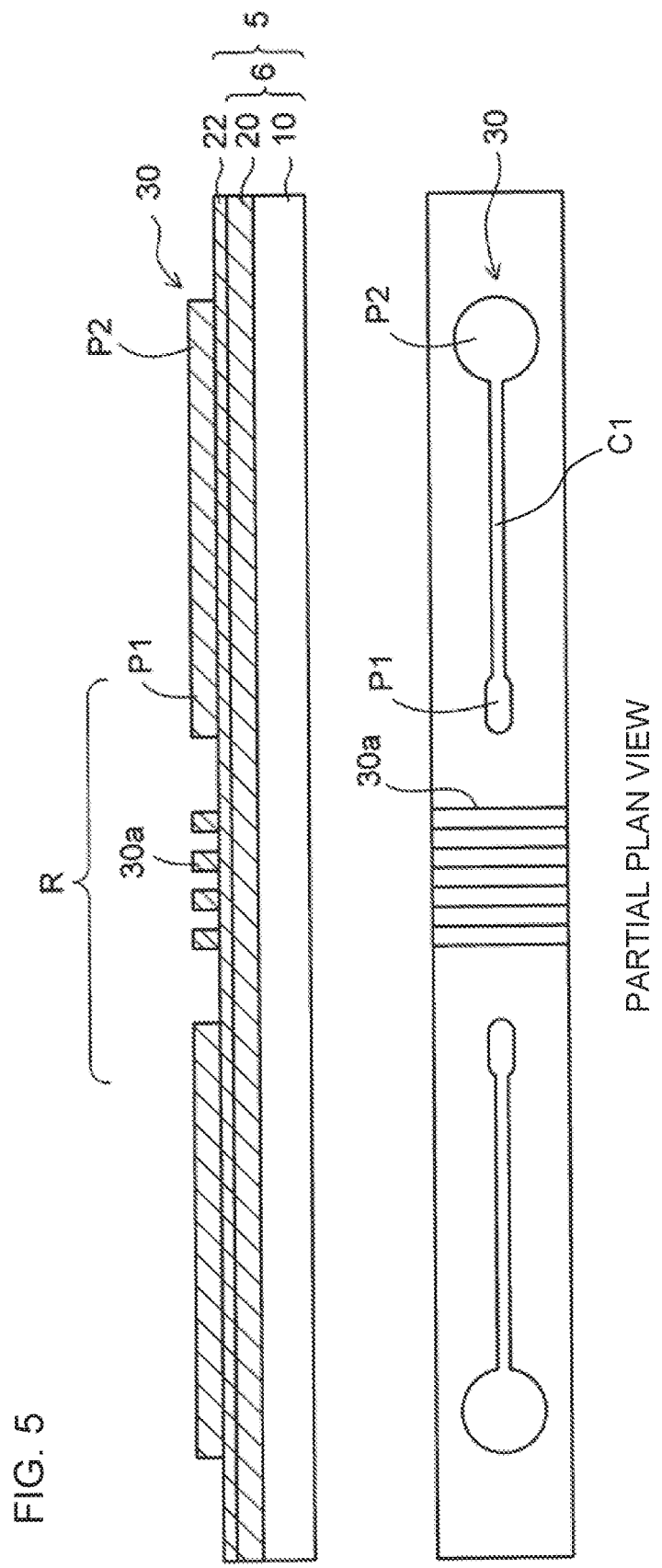

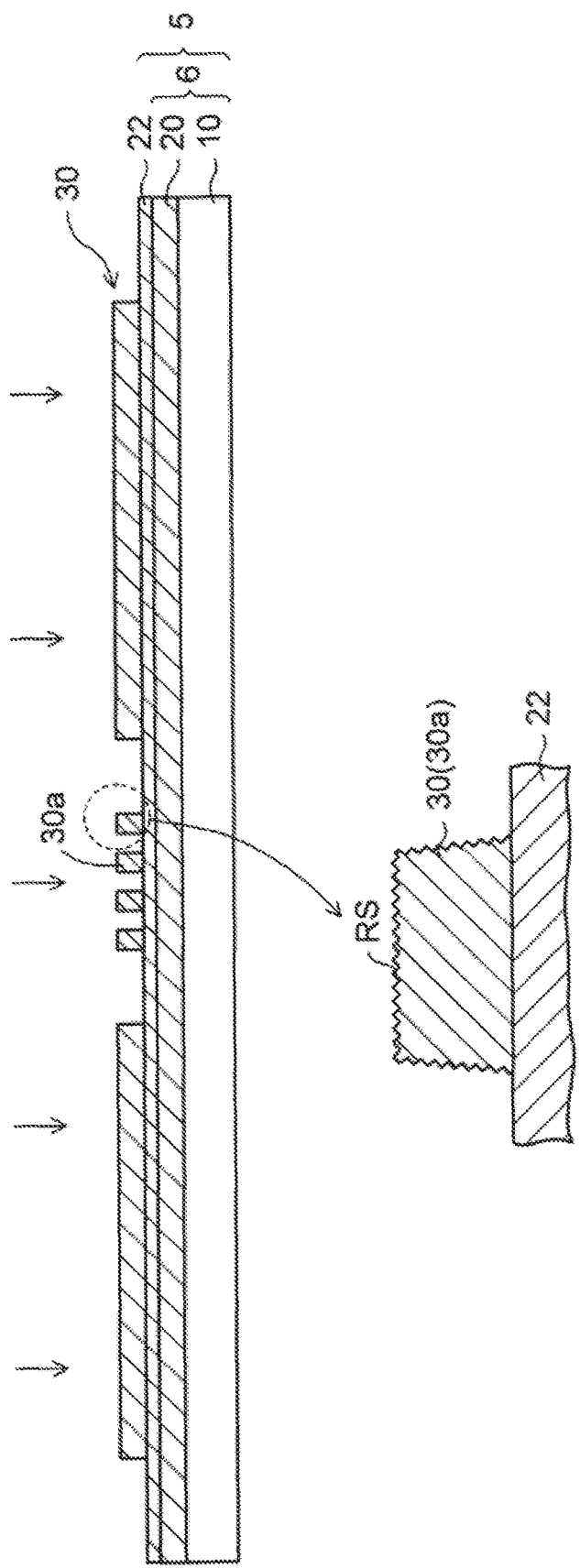

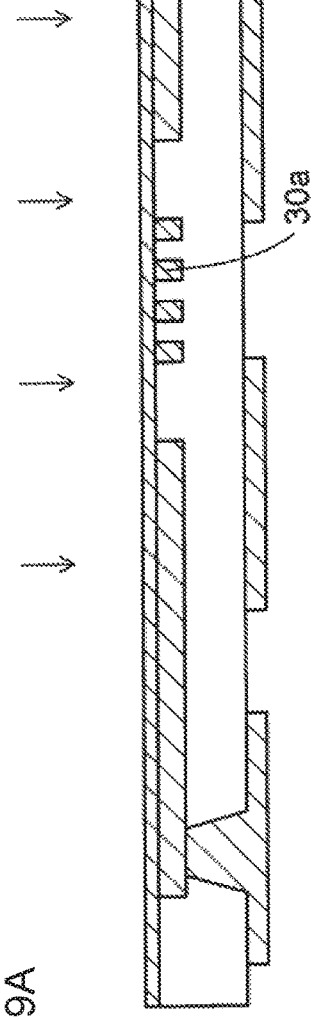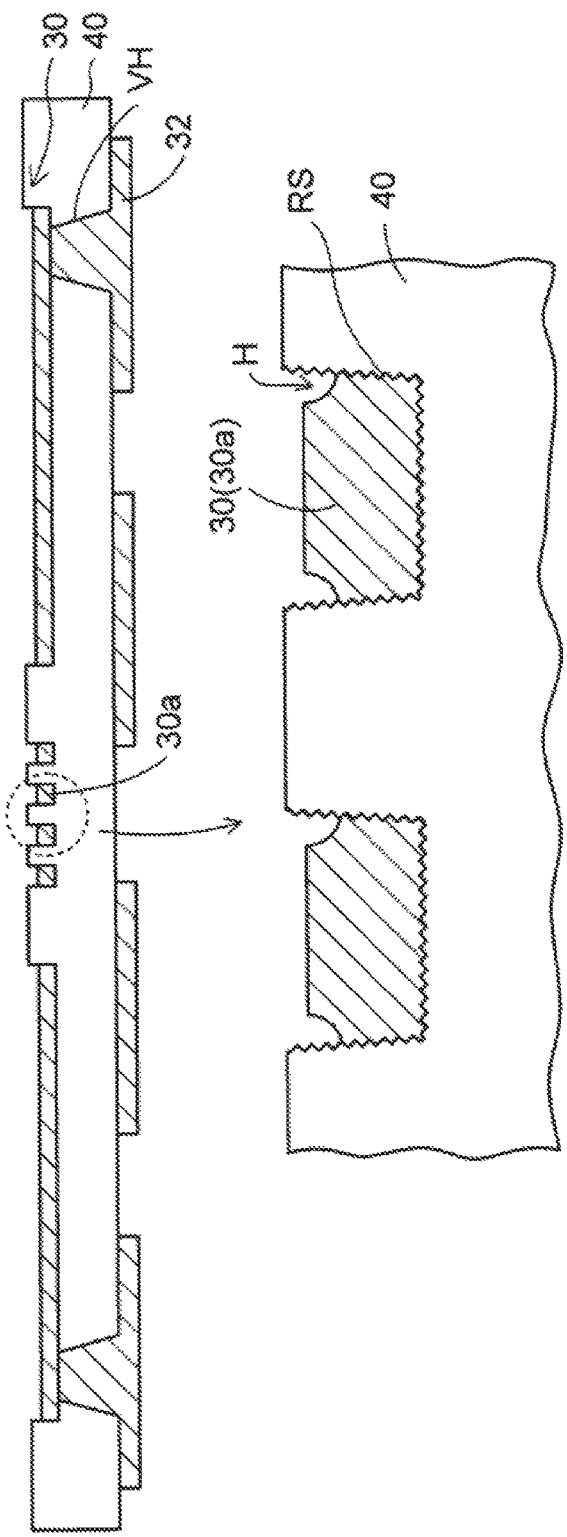

PARTIALLY ENLARGED SECTIONAL VIEW

PARTIALLY ENLARGED SECTIONAL VIEW

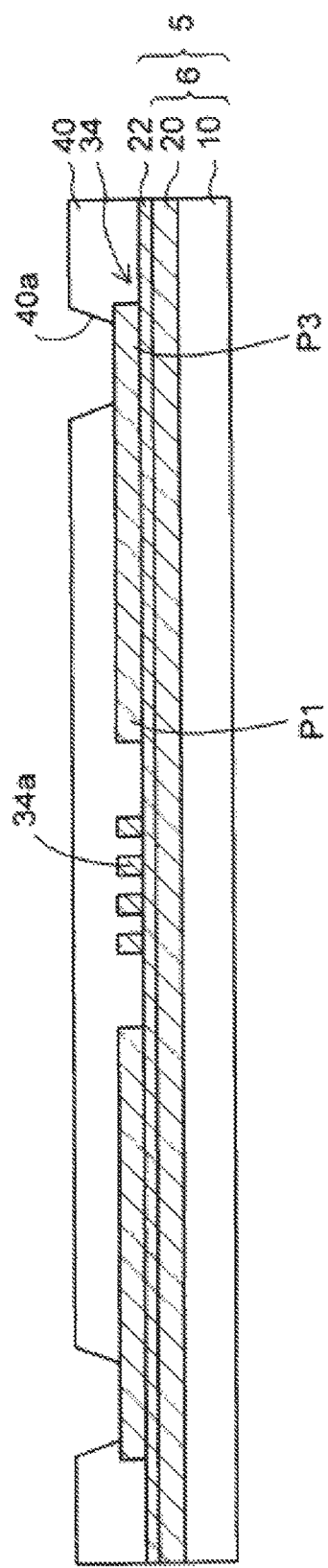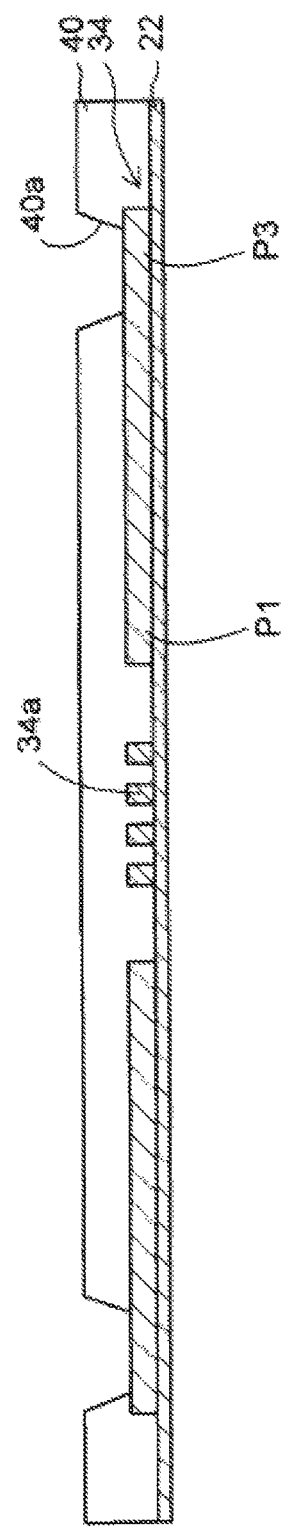

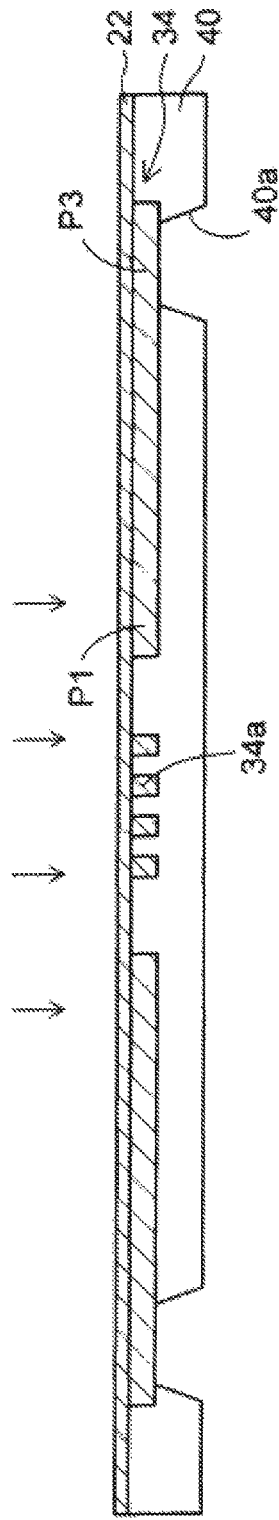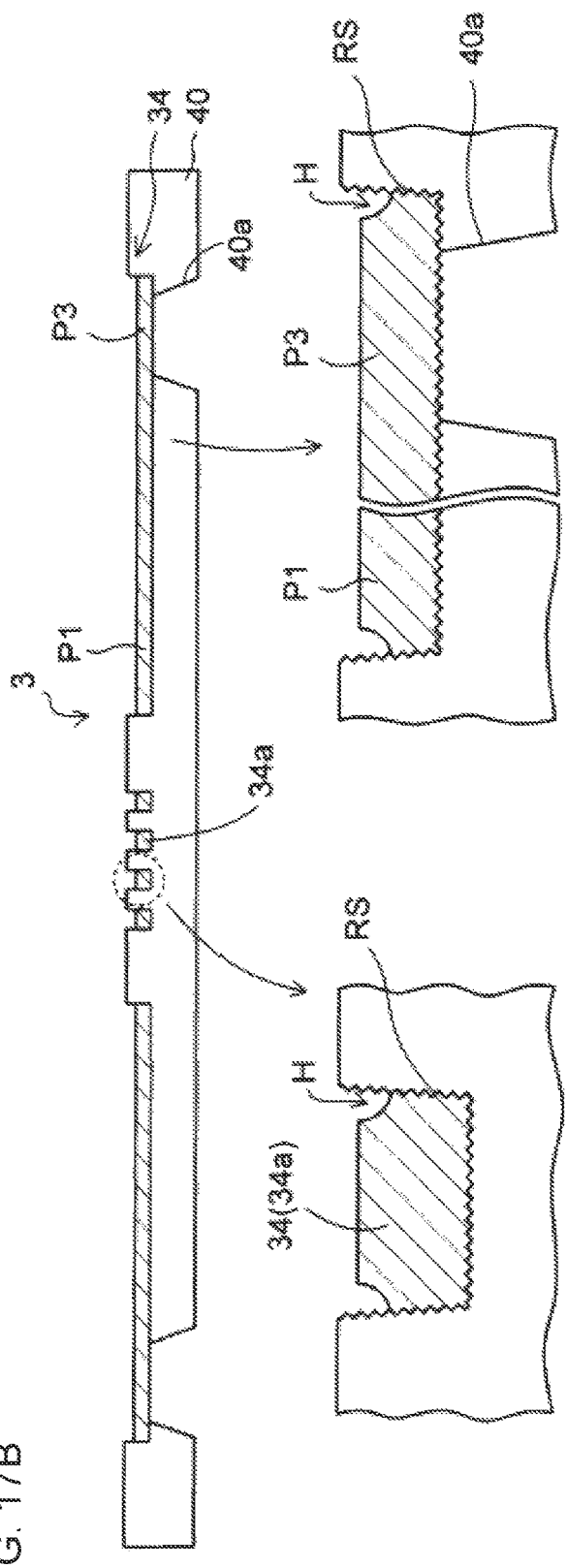

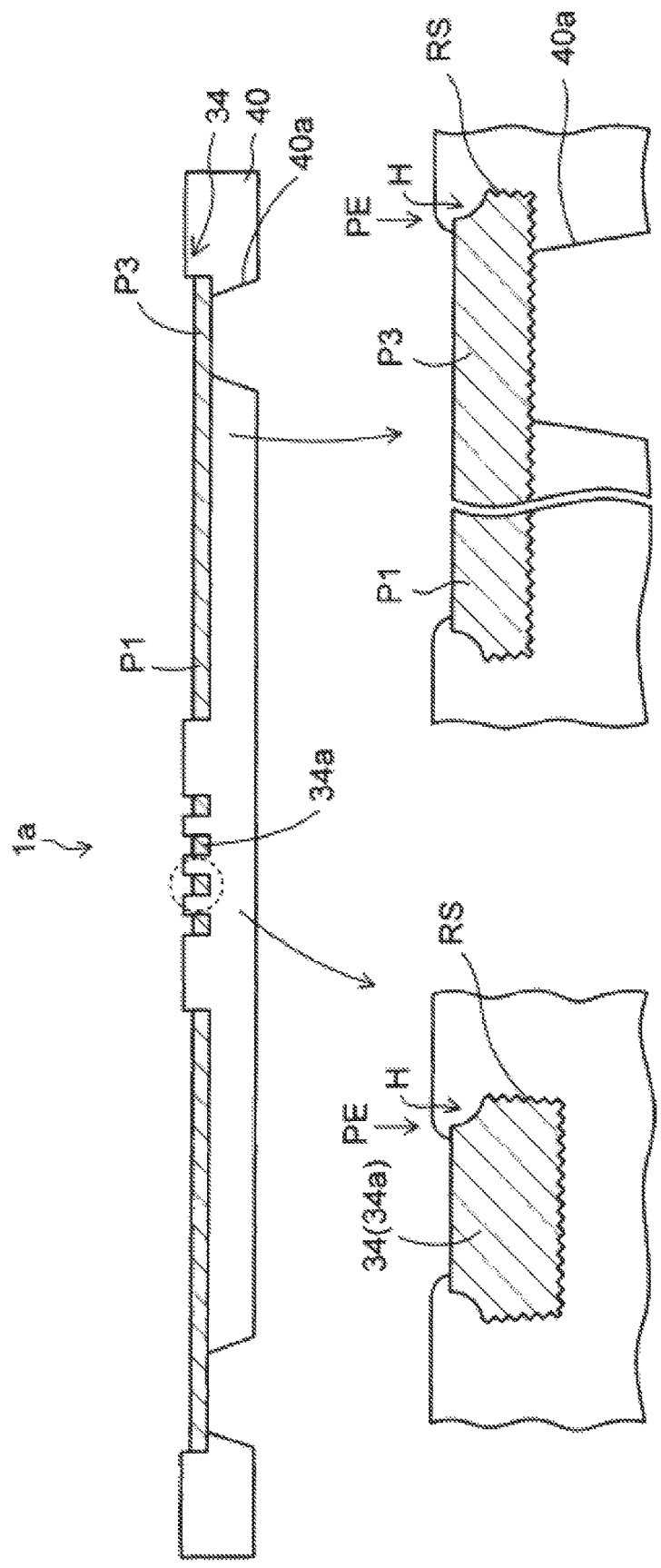

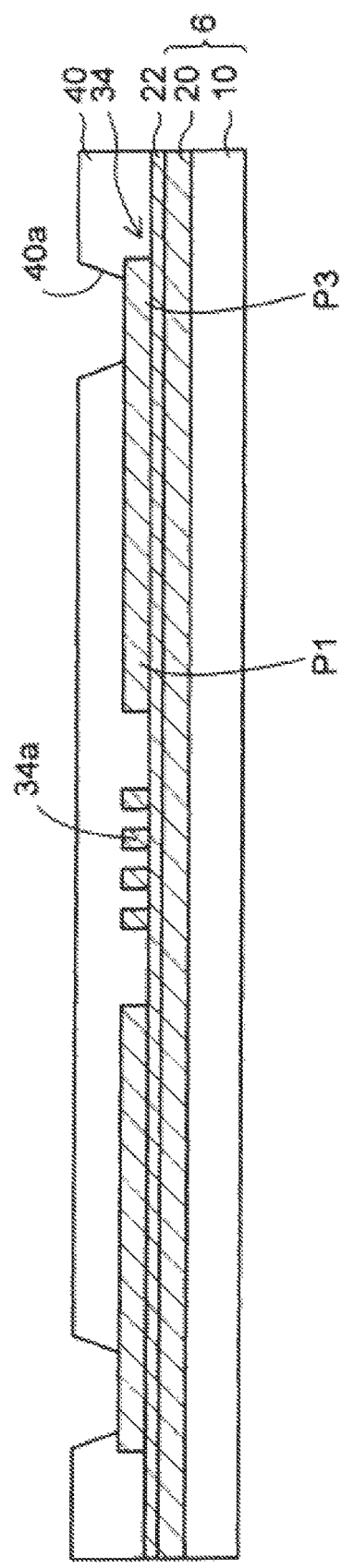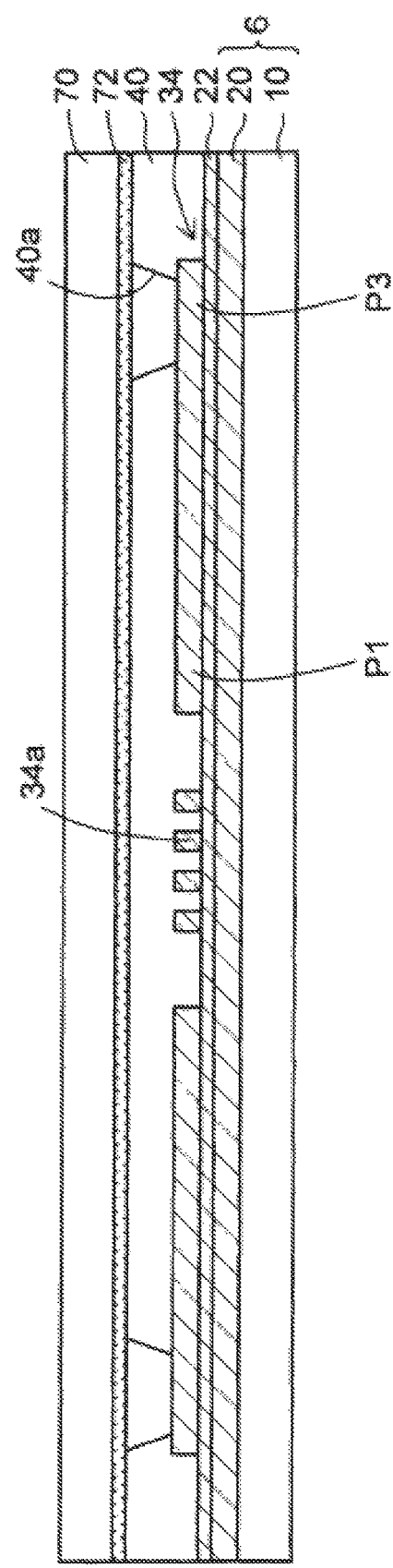

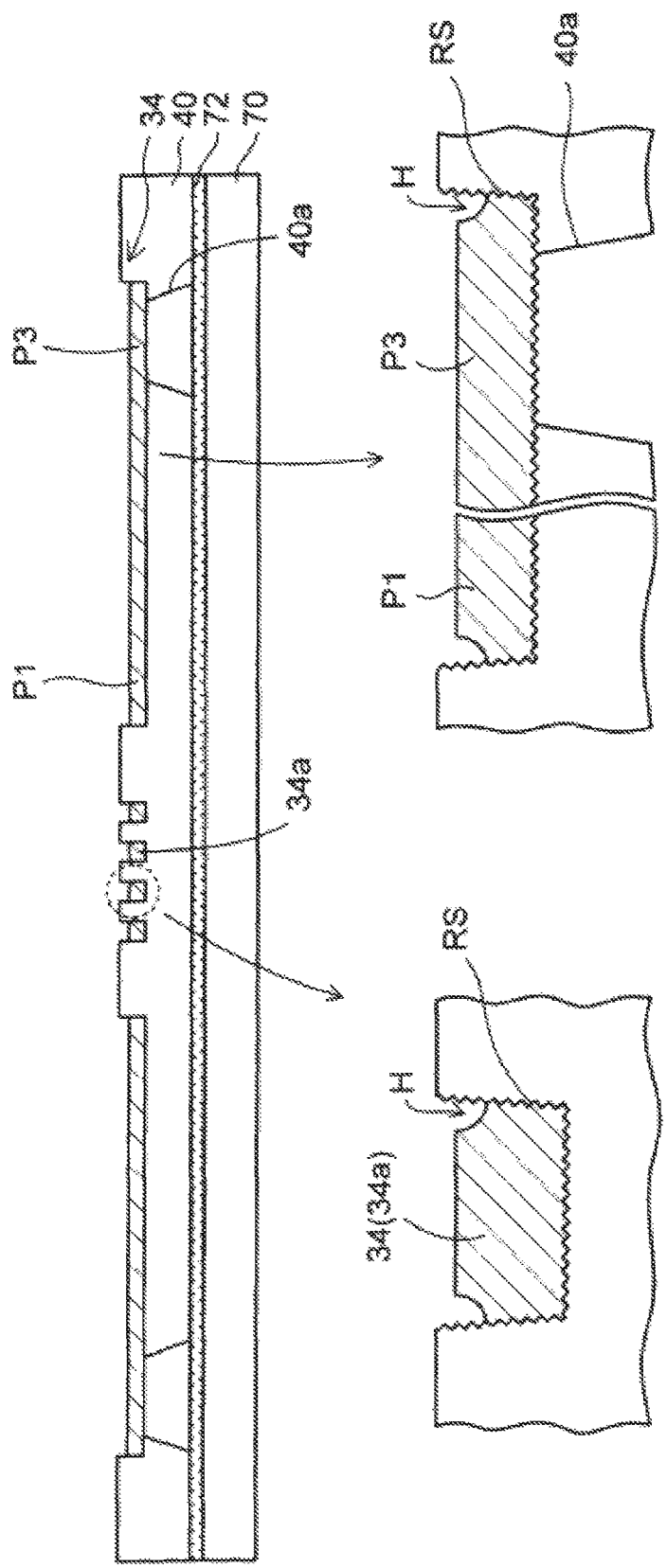

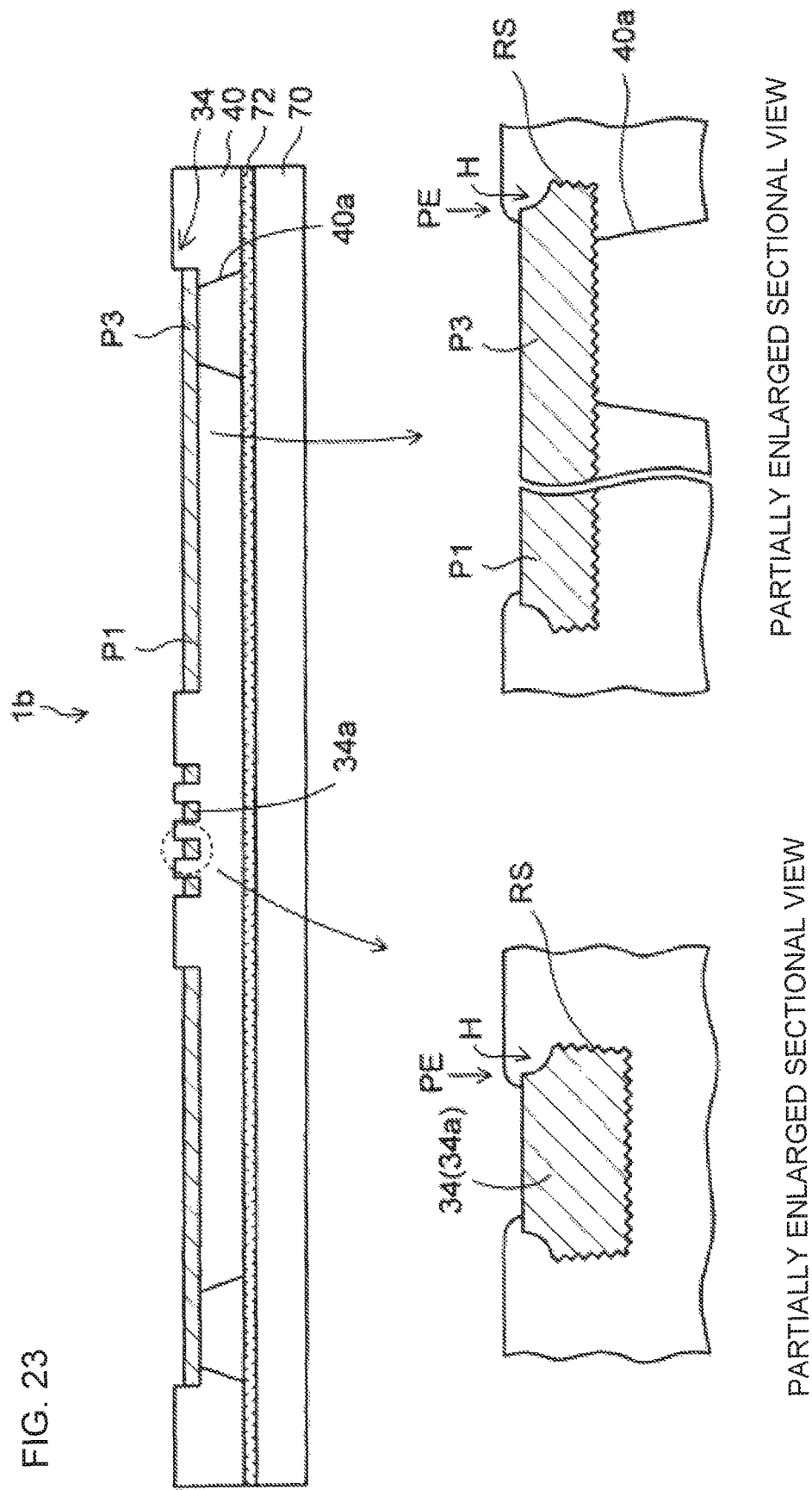

PARTIALLY ENLARGED SECTIONAL VIEW

WIRING BOARD AND ELECTRONIC COMPONENT DEVICE

This application claims priority from Japanese Patent Application Nos. 2015-155697, filed on Aug. 6, 2015, and 2016-142613, filed on Jul. 20, 2016, the entire contents of which are herein incorporated by reference.

BACKGROUND

1. Technical Field

The present disclosure relates to a wiring board and an electronic component device having the wiring board.

2. Description of the Related Art in the related arts, there are wiring boards for mounting electronic components such as semiconductor chips. In such a wiring board, terminals of a semiconductor chip are flip-chip connected to pads exposed from an insulating layer (see e.g., JP-A-2005-101137).

As will be described in an undermentioned preliminary matter, a coreless type wiring board is manufactured based on the following manner. That is, a wiring layer is formed on a temporary substrate through a copper foil, and the copper foil is wet-etched after the temporary substrate is removed. When the copper foil is wet-etched, a recess portion is formed in each outer edge portion of the wiring layer.

A sulfuric acid component of an etchant is apt to stay behind in the recess portion in the outer edge portion of the wiring layer. Accordingly, there is a problem that the sulfuric acid component may react with an atmospheric moisture content to turn into sulfate ions to thereby corrode the wiring layer or cause ionic migration.

SUMMARY

According to one or more aspects of the present disclosure, there is provided a wiring board. The wiring board includes: an insulating layer; and a wiring layer including: an upper surface; a lower surface opposite to the upper surface; and a side surface between the upper surface and the lower surface, wherein the upper surface of the wiring layer is exposed from the insulating layer, and the side surface and the lower surface of the wiring layer are embedded in the insulating layer. A recess portion is formed in an outer edge portion of the upper surface of the wiring layer, and the recess portion is filled with the insulating layer.

According to one or more aspects of the present disclosure, it is possible to provide a wiring board with high reliability and an electronic component device having the wiring board.

BRIEF DESCRIPTION OF THE DRAWINGS

FIG. 5 is a sectional view (part 3) showing the method for manufacturing the wiring board according to the first embodiment;

FIG. 6 is a sectional view (part 4) showing the method for manufacturing the wiring board according to the first embodiment;

FIGS. 9A and 9B are sectional views (part 7) showing the method for manufacturing the wiring board according to the first embodiment;

FIGS. 16A and 16B are sectional views (part 1) showing a method for manufacturing a wiring board according to a second embodiment;

FIGS. 17A and 17B are sectional views (part 2) showing the method for manufacturing the wiring board according to the second embodiment;

FIG. 19 is a sectional view showing the wiring board according to the second embodiment;

FIGS. 20A and 20B are sectional views (part 1) showing a method for manufacturing a wiring board according to a third embodiment;

FIG. 22 is a sectional view (part 3) showing the method for manufacturing the wiring board according to the third embodiment;

FIG. 23 is a sectional view showing the wiring board according to the third embodiment;

DETAILED DESCRIPTION

Embodiments will be described below respectively with reference to the accompanying drawings. Incidentally, a characteristic part is enlarged and shown in some accompanying drawings for convenience's sake in order to make it easy to understand that characteristic, and the dimensional ratios etc. of respective constituent elements do not always agree with real ones. In addition, hatching of a part of members may be omitted in each sectional view in order to make it easy to understand the sectional structure of each member.

A preliminary matter underlying the respective embodiments will be described prior to description of the respective embodiments.

FIGS. 1A to 1D and FIGS. 2A to 2C are views for explaining a problem of a coreless type wiring board according to the preliminary matter. Statement of the preliminary matter contains the details of personal study of the present inventor rather than known techniques.

Figure 1A:
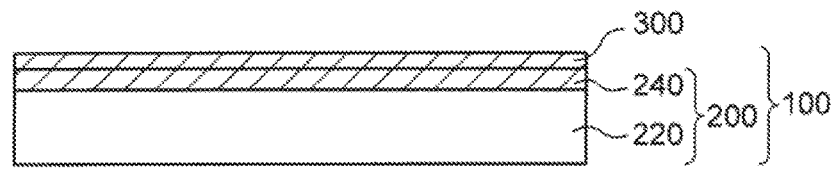
FIGS. 1A to 1D are sectional views (part 1) for explaining a problem of a wiring board according to a preliminary matter.

In a method for manufacturing a coreless type wiring board, first, a layered substrate 100 shown in FIG. 1A is prepared. The layered substrate 100 includes a temporary substrate 200 which is formed of a prepreg 220 and a first copper foil 240 bonded thereon. The layered substrate 100 further includes a second copper foil 300 which is formed releasably on the first copper foil 240 of the temporary substrate 200.

Figure 1B:
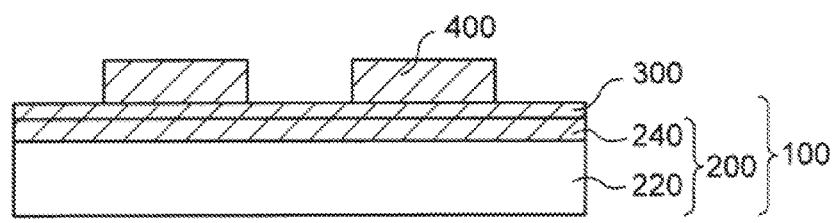

Next, as shown in FIG. 1B, a first wiring layer 400 made of copper is formed on the second copper foil 300 on the temporary substrate 200.

Figure 1C:
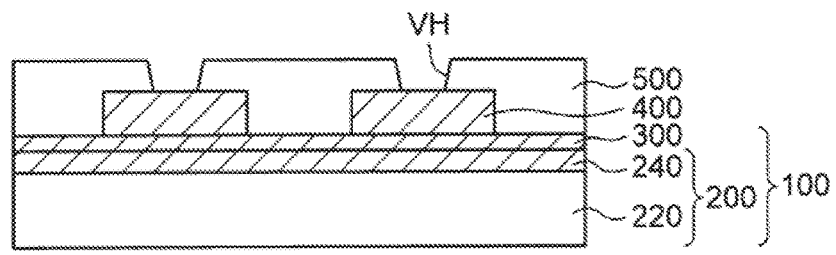

Successively, a resin film is pasted on the second copper foil 300 and the first wiring layer 400 so that an insulating layer 500 is formed, as shown in FIG. 1C. Further, the insulating layer 500 is processed by a laser so that via holes VH are formed in the insulating layer 500 to reach the first wiring layer 400.

Figure 1D:
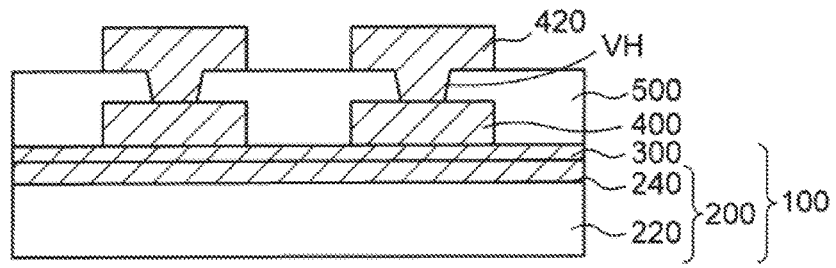

Successively, as shown in FIG. 1D, a second wiring layer 420 is formed on the insulating layer 500 to be connected to the first wiring layer 400 through via conductors inside the via holes VH.

Figure 2A:
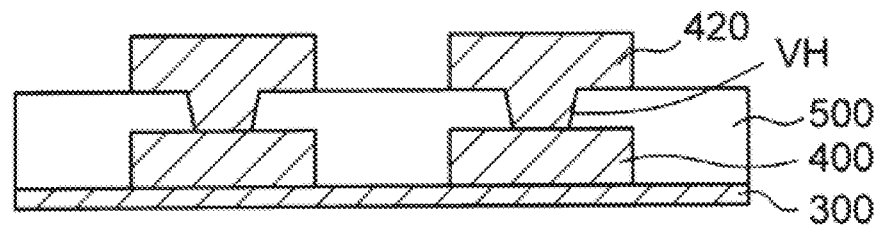
FIGS. 2A to 2C are sectional views (part 2) for explaining the problem of the wiring board according to the preliminary matter.

Next, as shown in FIG. 2A, the first copper foil 240 of the temporary substrate 200 is released from the second copper foil 300 at an interface between the both so that the temporary substrate 200 is separated from the second copper foil 300.

Figure 2B:
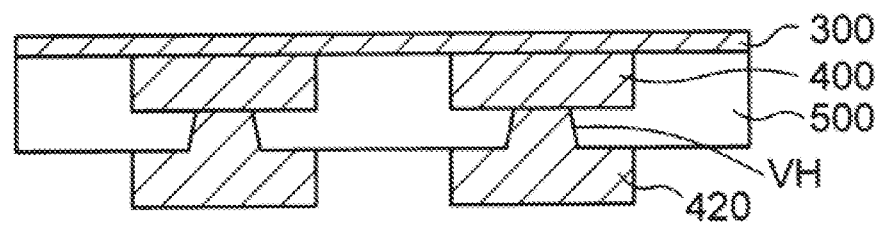

Next, a state in which the structure shown in FIG. 2A has been turned upside down is shown in FIG. 2B. As shown in FIG. 2B, the second copper foil 300 is removed by wet etching by a mixture solution of sulfuric acid and hydrogen peroxide water in a state in which the second wiring layer 420 has been protected by a protective sheet (not shown).

Figure 2C:
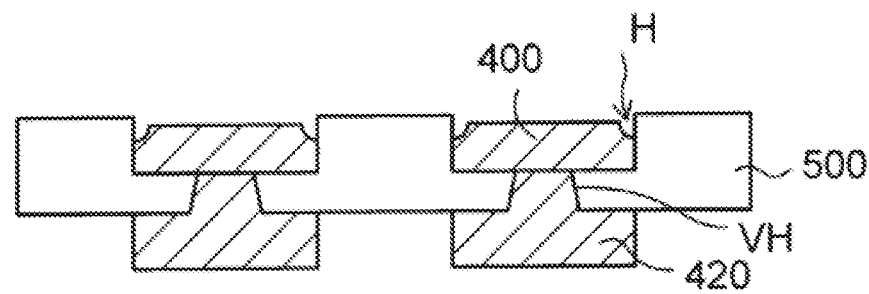

Thus, as shown in FIG. 2C, an upper surface of the first wiring layer 400 and an upper surface of the insulating layer 500 are exposed. On this occasion, a large amount of etchant easily enters the inside of the insulating layer 500 from an interface between a side surface of the first wiring layer 400 and the insulating layer 500.

Therefore, an etching rate in each outer edge portion of the first wiring layer 400 is higher than an etching rate in each central main portion of the first wiring layer 400. As a result, a recess portion H is formed as a fine gap in the outer edge portion of the first wiring layer 400.

After the second copper foil 300 has been wet-etched, water washing and drying steps are performed on the structure shown in FIG. 2C. A sulfuric acid component of the mixture solution of sulfuric acid and hydrogen peroxide water is however apt to stay behind in a solidified state in the recess portion H in the outer edge portion of the first wiring layer 400.

When the sulfuric acid component stays behind in the recess portion H of the first wiring layer 400, there is a problem that the sulfuric acid component may react with an atmospheric moisture content to turn into sulfate ions to thereby corrode the first wiring layer 400.

Assume that voltage is applied to the first wiring layer 400 under an environment containing a moisture content when the sulfuric acid component stays behind in the recess portion H of the first wiring layer 400. In this case, ionic migration may occur to thereby cause electrical short-circuiting in the first wiring layer 400 easily.

Therefore, reliability of insulation properties of the insulating layer 500 disposed horizontally on the first wiring layer 400 is lowered.

Further, when the recess portion H is formed in the outer edge portion of the first wiring layer 400, the contact area between the first wiring layer 400 and the insulating layer 500 is reduced. Therefore, there is a fear that satisfactory adhesion between the first wiring layer 400 and the insulating layer 500 may not be obtained.

The aforementioned problem can be solved by a wiring board, a method for manufacturing the wiring board, and an electronic component device according to an embodiment which will be described as follows.

First Embodiment

Figure 14:
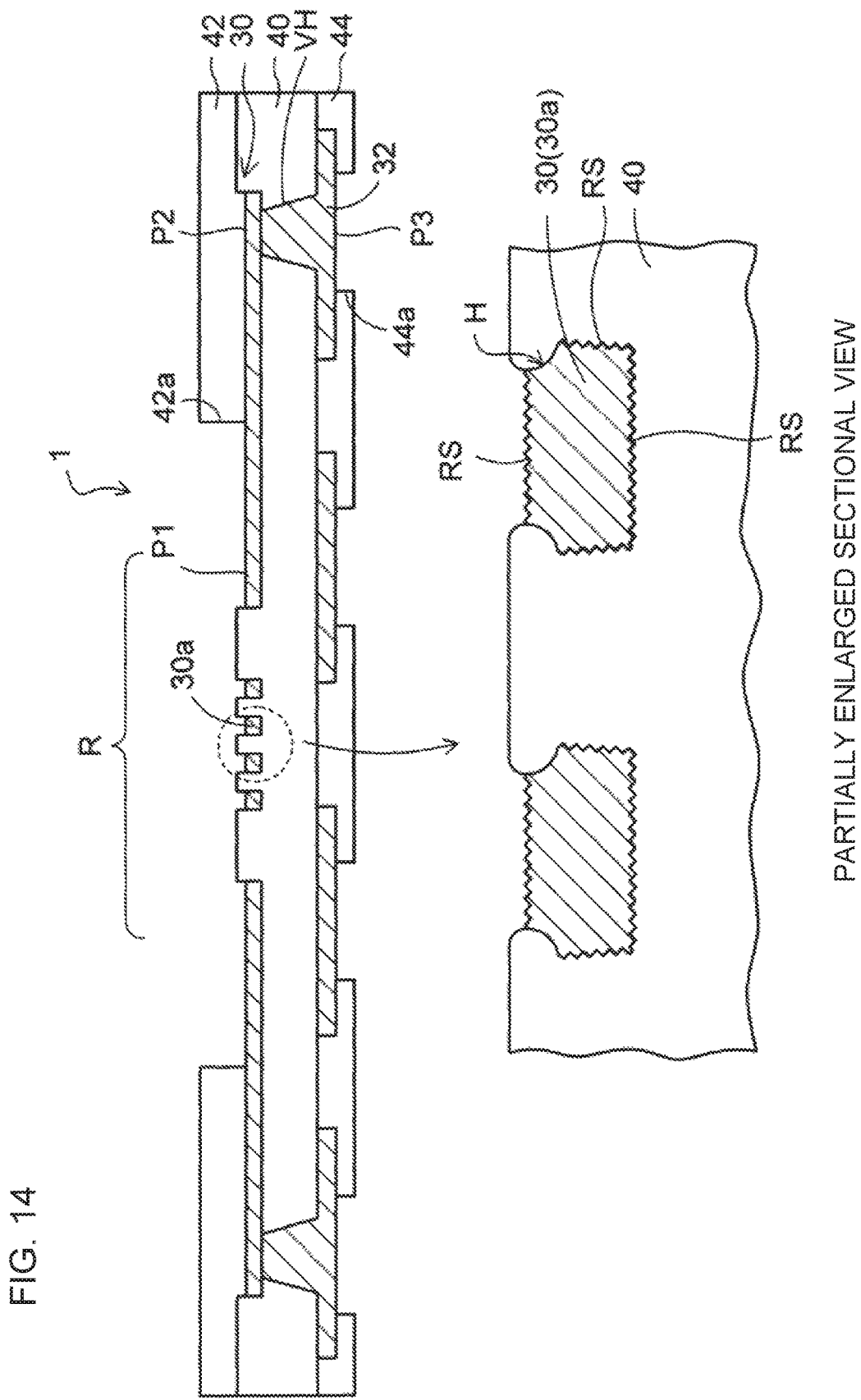
FIG. 14 is a sectional view showing the wiring board according to the first embodiment.
Figure 15:
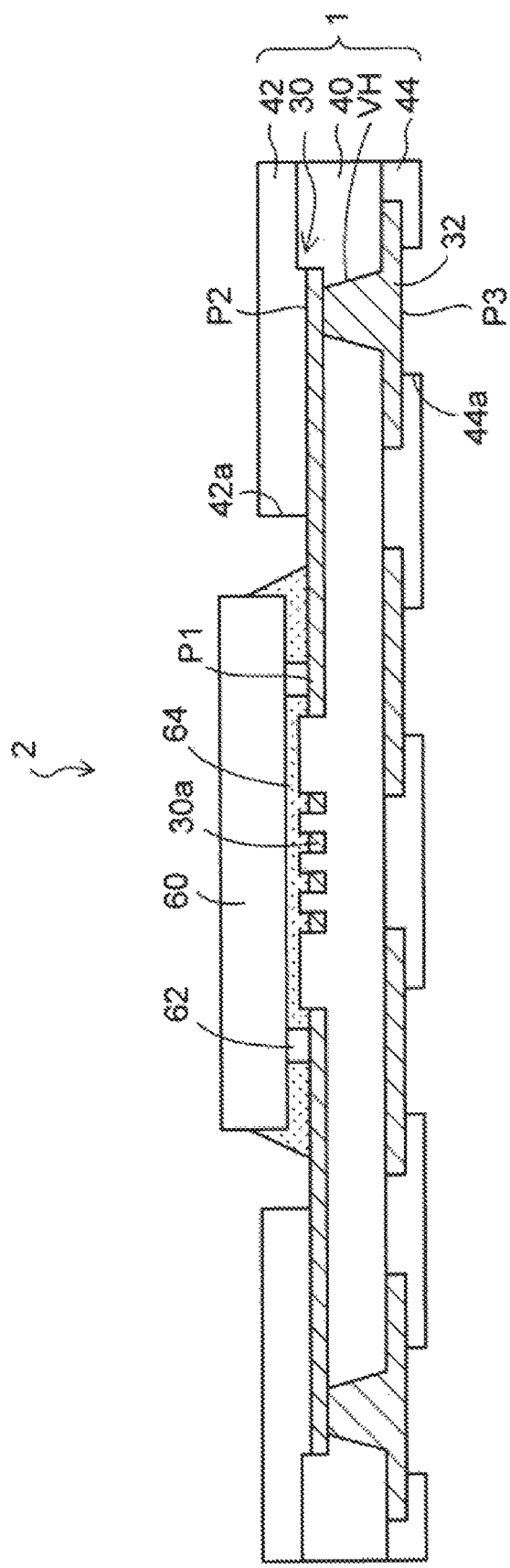
FIG. 15 is a sectional view showing an electronic component device according to the first embodiment.

FIGS. 3A and 3B, FIGS. 4 to 6, FIGS. 7A and 7B, FIGS. 8A and 8B, FIGS. 9A and 9B, FIG. 10, FIGS. 11A and 11B, and FIGS. 12 and 13 are views showing the method for manufacturing the wiring board according to the first embodiment. FIG. 14 is a view showing the wiring board according to the first embodiment. FIG. 15 is a view showing the electronic component device according to the first embodiment.

The structure of the wiring board and the structure of the electronic component device will be described below while the method for manufacturing the wiring board and the method for manufacturing the electronic component device are described.

Figure 3A:
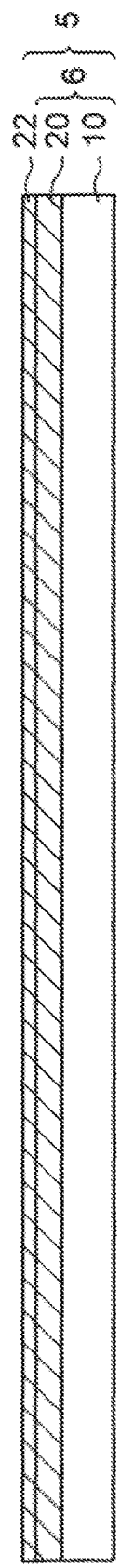
FIGS. 3A and 3B are sectional views (part 1) showing a method for manufacturing a wiring board according to a first embodiment.

In the method for manufacturing the wiring board according to the first embodiment, first, a layered substrate 5 shown in FIG. 3A is prepared. The layered substrate 5 includes a temporary substrate 6 which is formed of a prepreg 10 and a first copper foil 20 bonded thereon. Further, the layered substrate 5 includes a second copper foil 22 which is formed releasably on the first copper foil 20 of the temporary substrate 6.

The prepreg 10 is a composite material formed by impregnating reinforcing fiber such as glass fiber, carbon fiber or aramid fiber in woven or unwoven fabric with a resin such as an epoxy resin or a polyimide resin.

For example, the thickness of the prepreg 10 of the temporary substrate 6 is 50 μm to 500 μm. The thickness of the first copper foil 20 is 12 μm to 70 μm. In addition, the thickness of the second copper foil 22 is 2 μm to 3 μm.

A release agent (not shown) is formed between the first copper foil 20 of the temporary substrate 6 and the second copper foil 22 so that the first copper foil 20 of the temporary substrate 6 can be released easily from the second copper foil 22 at an interface between the both. A silicon-based release agent, a fluorine-based release agent, or any release agent in which particles containing a metal component are mixed into components of these release agents, etc. may be used as the release agent.

In this manner, the temporary substrate in which the metal foil is formed releasably as the outermost layer is prepared.

As long as a metal foil can be formed releasably on the temporary substrate, various structures may be used as the layer configuration of the temporary substrate under the metal foil. The second copper foil 22 is an example of the metal foil formed on the temporary substrate.

Figure 3B:
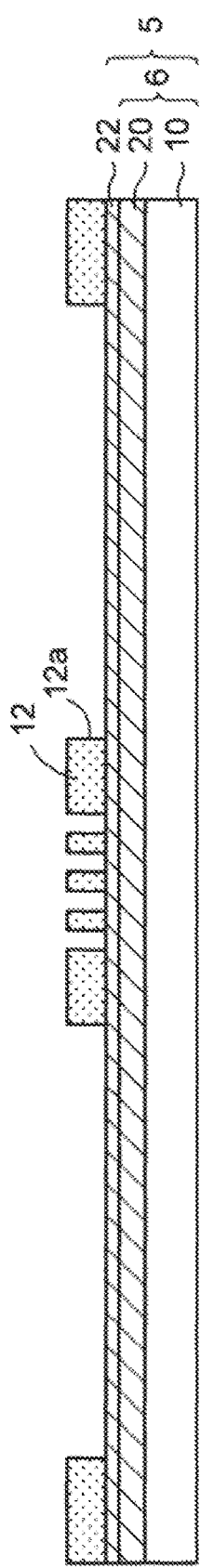

Next, as shown in FIG. 3B, a plating resist layer 12 having opening portions 12a provided in regions where a first wiring layer should be disposed is formed on the second copper foil 22.

Figure 4:
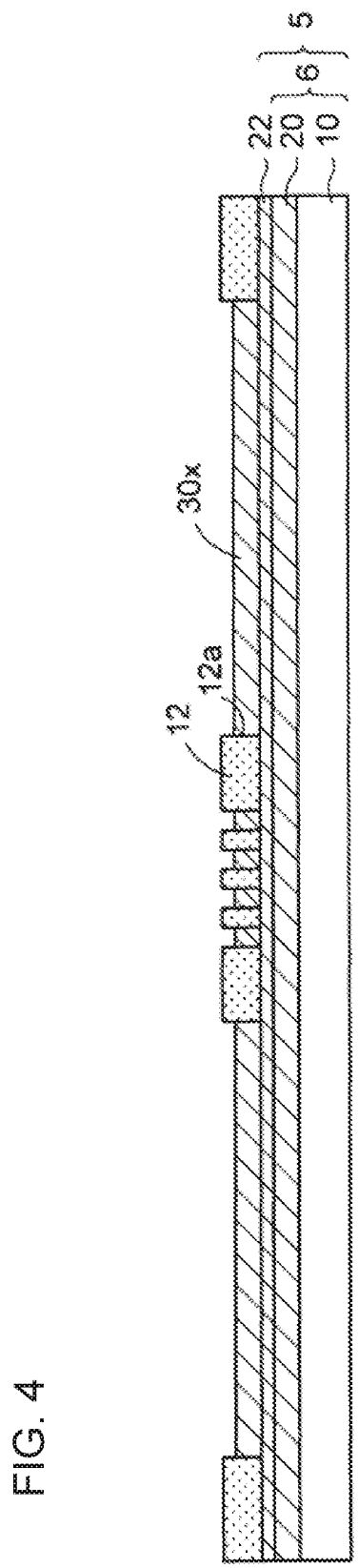
FIG. 4 is a sectional view (part 2) showing the method for manufacturing the wiring board according to the first embodiment.

Successively, as shown in FIG. 4, a copper plating layer 30x is formed inside the opening portions 12a of the plating resist layer 12 by electrolytic plating using the second copper foil 22 as a plating power feed passage. The copper plating layer 30x is an example of an electrolytic metal plating layer. The metal foil formed on the temporary substrate and the electrolytic metal plating layer are made of the same metal.

Next, as shown in FIG. 5, the plating resist layer 12 is removed. Thus, a first wiring layer 30 is formed of the copper plating layer 30x.

When the layered substrate 5 for obtaining multiple pieces is used, a plurality of product regions is defined in the layered substrate 5. One product region of the layered substrate 5 is shown in FIG. 5. A central portion of the product region serves as an electronic component mounting region R.

As shown in a partial plan view of FIG. 5, the first wiring layer 30 includes electronic component mounting pads P1, via receiving pads P2, and wiring portions C1 through which the electronic component mounting pads P1 and the via receiving pads P2 are connected to each other. In addition, the first wiring layer 30 is formed to include fine wiring portions 30a disposed in a central portion of the electronic component mounting region R.

When a wiring layer is formed by a general semi-additive method, it is necessary to include a step of etching a seed layer with a copper plating layer as a mask. Since an etching rate of the seed layer is higher than that of the copper plating layer, the seed layer is apt to be formed into an undercut shape which is cut inward.

According to the first embodiment, the first wiring layer 30 is formed only of the copper plating layer 30x and it is not necessary to include the step of etching a seed layer. Therefore, undercutting does not occur in a base portion of the first wiring layer 30 so that a finer wiring layer can be formed.

Successively, as shown in FIG. 6, roughing treatment is applied to the first wiring layer 30 with a formic acid-based aqueous solution to thereby form upper and side surfaces of the first wiring layer 30 into roughened surfaces (RS). The surface roughness (Ra) of the first wiring layer 30 is set in a range of from 100 nm to 500 nm. For example, the surface roughness (Ra) of the first wiring layer 30 is set at 300 nm. When the surface of another wiring layer is formed into a roughened surface, the surface may be also set to have similar surface roughness. In addition, in the description about FIG. 9A and subsequent figures, the structure shown in FIG. 8B has been turned upside down and thus the upper surface of the first wiring layer 30 shown in FIG. 6 has become the lower surface of the first wiring layer 30. Accordingly, the description about FIG. 9A and subsequent figures will be made on the condition that the lower surface of the first insulating wiring 30 is roughed.

Figure 7A:
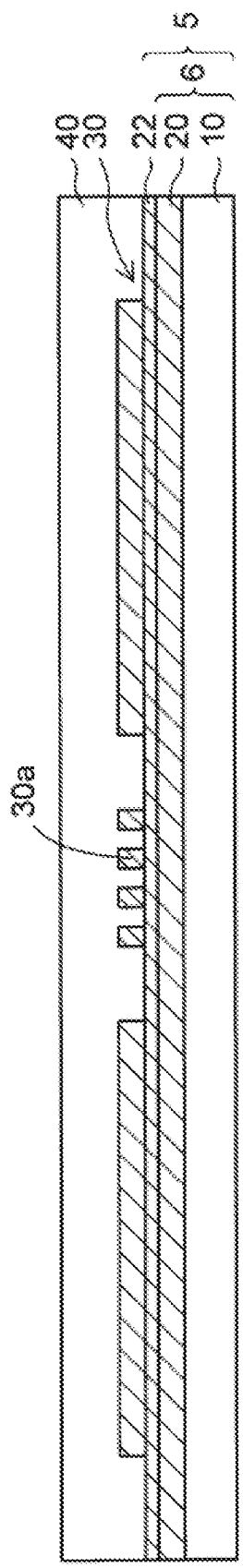
FIGS. 7A and 7B are sectional views (part 5) showing the method for manufacturing the wiring board according to the first embodiment.

Next, a semi-hardened resin film is pasted on the first wiring layer 30 and the second copper foil 22 and subjected to heat treatment to be hardened so that an insulating layer 40 is formed, as shown in FIG. 7A. A thermosetting resin such as an epoxy resin or a polyimide resin may be used for the resin film. Alternatively, the insulating layer 40 may be formed by applying a liquid thermosetting resin When the thermosetting epoxy resin is used, the semi-hardened resin can be completely hardened by heat treatment at about 230° C.

Alternatively, the insulating layer 40 may be formed by pasting a semi-hardened prepreg and hardening the prepreg by heat treatment. When the prepreg is used, a similar material to that of the prepreg 10 of the aforementioned temporary substrate 6 in FIG. 3A may be used.

Figure 7B:
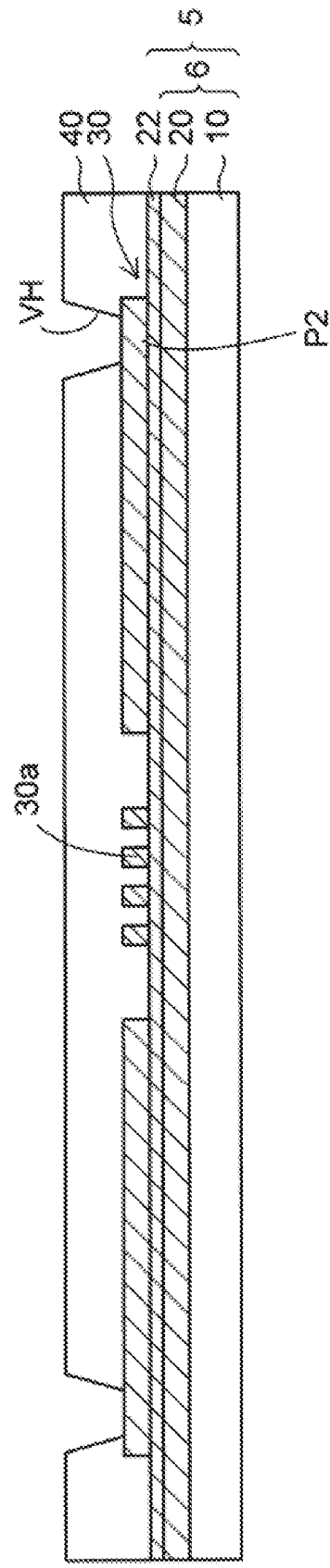

Then, when the insulating layer 40 is processed by a laser, via holes VH are formed in the insulating layer 40 to reach the via receiving pads P2 of the first wiring layer 30, as shown in FIG. 7B. Further, when the via holes VH are internally dismeared by a potassium permanganate method etc., resin smears are removed and cleaned.

Alternatively, the insulating layer 40 including the via holes VH may be formed by patterning a photosensitive resin based on photolithography.

Figure 8A:
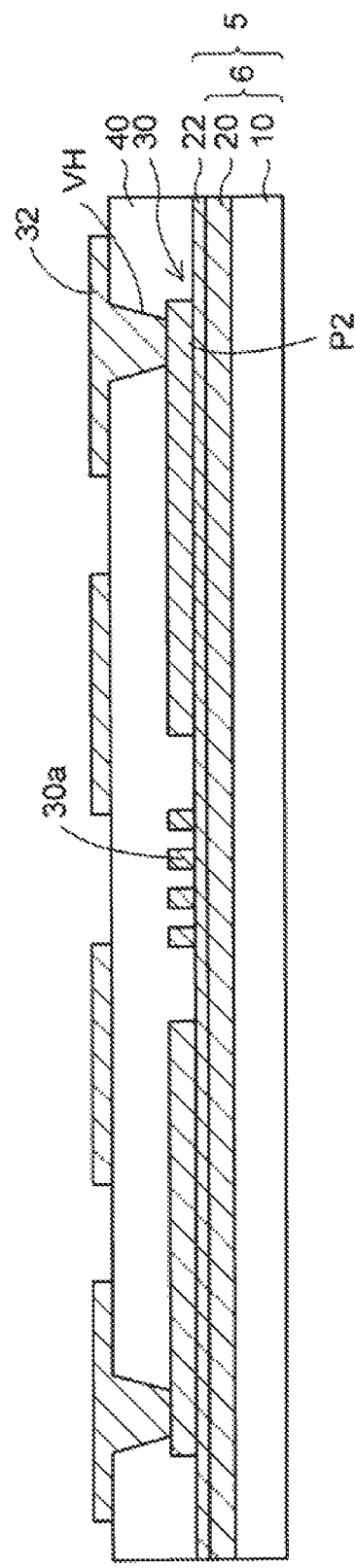
FIGS. 8A and 8B are sectional views (part 6) showing the method for manufacturing the wiring board according to the first embodiment.

Next, as shown in FIG. 8A, a second wiring layer 32 is formed on the insulating layer 40 to be connected to the first wiring layer 30 through via conductors inside the via holes VH. Each of the via holes VH and the via conductors filled in the via holes VH is formed into a circular truncated cone shape in which the diameter of an opening end side of the via hole VH is larger than the diameter of the bottom of the via hole VH on the side of the first wiring layer 30.

The second wiring layer 32 is formed, for example, by a semi-additive method. Specifically, a seed layer (not shown) made of copper etc. is formed on the insulating layer 40 and inner surfaces of the via holes VH by an electroless plating or sputtering method.

Next, a plating resist layer (not shown) including opening portions provided in regions where the second wiring layer 32 should be disposed is formed. Successively, after a metal plating layer (not shown) made of copper etc. is formed in the opening portions of the plating resist layer by electrolytic plating using the seed layer as a plating power feed passage, the plating resist layer is removed.

Further, the seed layer is removed by wet etching with the metal plating layer as a mask. Thus, the second wiring layer 32 is formed of the seed layer and the metal plating layer.

Incidentally, in the aforementioned embodiment, the temporary substrate 6 is formed to have the first copper foil 20 formed on one surface of the prepreg TO, and the multilayer wiring layer is formed on one surface of the temporary substrate 6 through the second copper foil 22. Alternatively, the temporary substrate may be formed to have the first copper foils 20 formed on the opposite surfaces of the prepreg 10 respectively, and the multilayer wiring layers may be formed on the opposite surface sides of the temporary substrate through the second copper foils 22 respectively.

Figure 8B:
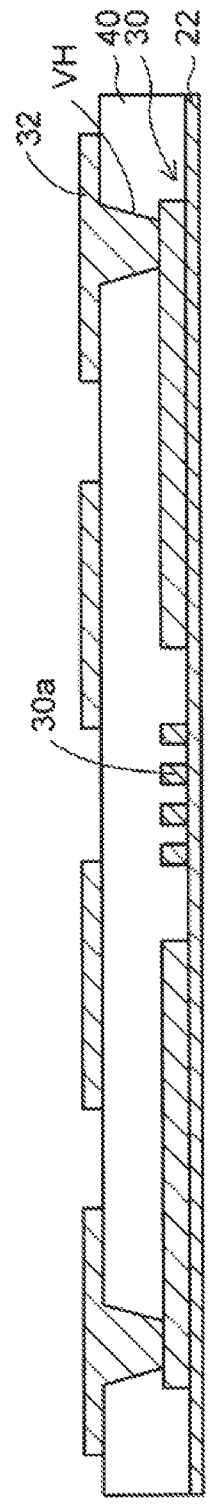

Successively, as shown in FIG. 8B, the first copper foil 20 of the temporary substrate 6 is released from the second copper foil 22 at an interface between the both so that the temporary substrate 6 is separated from the second copper foil 22.

Next, a state in which the structure shown in FIG. 8B has been turned upside down is shown in FIG. 9A. As shown in FIG. 9A, the second copper foil 22 is removed by wet etching in a state in which a protective sheet (not shown) has been pasted on a lower surface side of the insulating layer 40 to protect the second wiring layer 32. A mixture solution of sulfuric acid and hydrogen peroxide water may be used as an etchant for the second copper foil 22.

Thus, as shown in FIG. 9B, an upper surface of the first wiring layer 30 and an upper surface of the insulating layer 40 are exposed. The first wiring layer 30 is made of the same copper as that of the second copper foil 22. Therefore, the first wiring layer 30 is etched when overetching is performed after completion of wet etching on the second copper foil 22.

On this occasion, a large amount of the etchant easily enters the inside of the insulating layer 40 from an interface between a side surface of the first wiring layer 30 and the insulating layer 40 during the overetching, as has been described in the preliminary matter.

Therefore, an etching rate of each outer edge portion of the first wiring layer 30 is higher than an etching rate of each central main portion of the first wiring layer 30. As a result, a recess portion H is formed as a fine gap in the whole of the outer edge portion of the first wiring layer 30. In short, the recess portion H is formed in the outer edge portion of each electronic component mounting pad P1, in the outer edge portion of each via receiving pad P2, in the outer edge portion of each wiring portion C1, and in the outer edge portion of each fine wiring portion 30a, respectively.

The recess portion 11 is formed to extend in a thickness direction from the outer edge portion of the upper surface of the first wiring layer 30. An upper end-side side surface of the insulating layer 40 is exposed on an outer side of the recess portion H of the first wiring layer 30. For example, the width of the recess portion H in the first wiring layer 30 is about 1 μm to about 2 μm. For example, the depth of the recess portion H is 2 μm to 3 μm.

In addition, the central main portion of the first wiring layer 30 is also etched simultaneously. Accordingly, the height of the upper surface of the first wiring layer 30 is lower than the height of the upper surface of the insulating layer 40. For example, the upper surface of the first wiring layer 30 is disposed in a position lower by about 2 μm to about 3 μm than the upper surface of the insulating layer 40.

The upper surface of the first wiring layer 30 and the inner surface of the recess portion H are smooth surfaces subjected to etching. Accordingly, the upper surface of the first wiring layer 30 and the inner surface of the recess portion H are exposed as smooth surfaces smaller in surface roughness than the roughened surfaces RS which are the side and lower surfaces of the first wiring layer 30.

In the aforementioned manner, it is possible to obtain a wiring member 3 having a structure in which the first wiring layer 30 and the second wiring layer 32 on the opposite surface sides of the insulating layer 40 are connected to each other through the via conductors inside the via holes VH.

Figure 10:
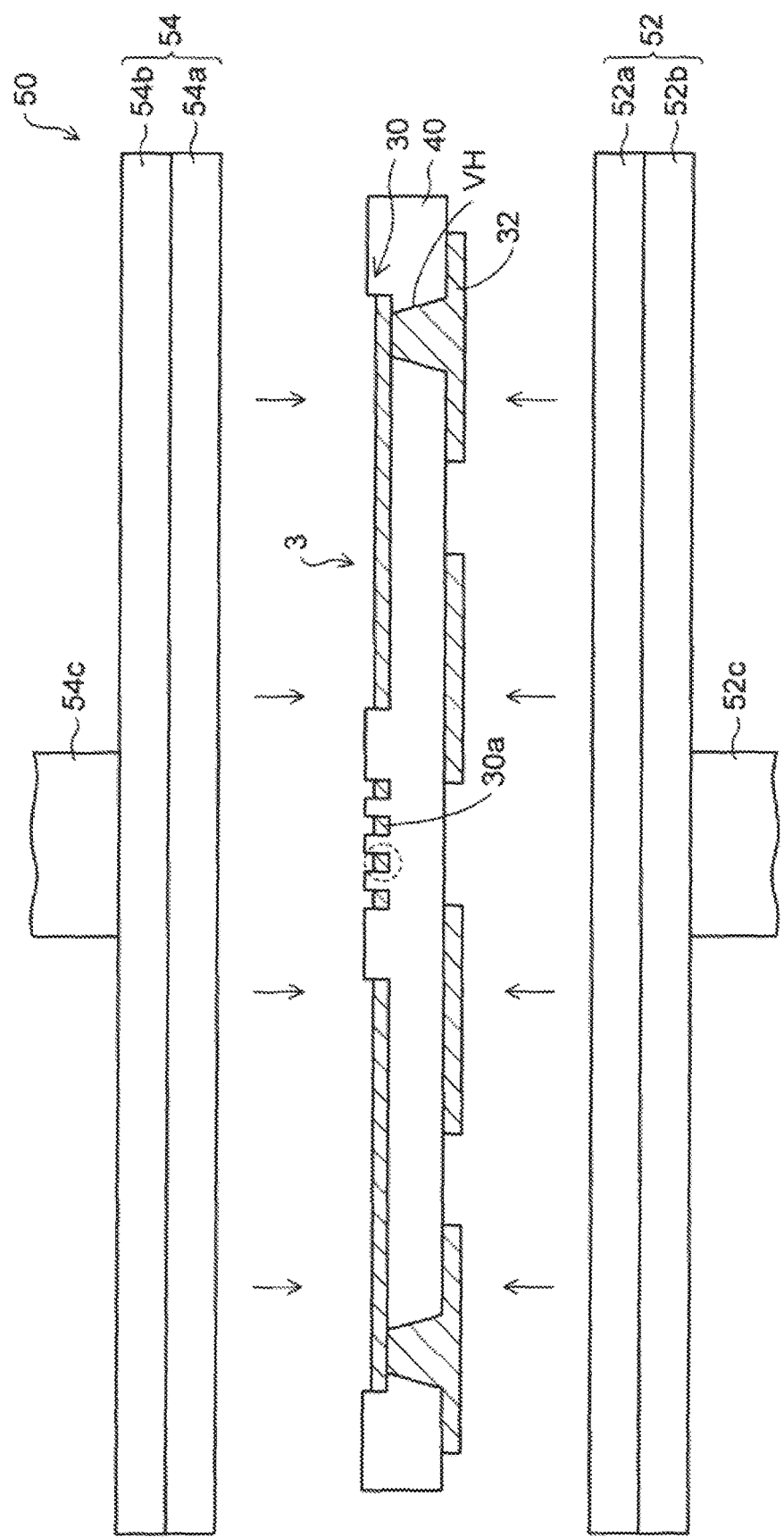
FIG. 10 is a sectional view (part 8) showing the method for manufacturing the wiring board according to the first embodiment.

Next, as shown in FIG. 10, a hot press device 50 is prepared. The hot press device 50 includes a lower side hot press plate 52, and an upper side hot press plate 54. The lower side hot press plate 52 is formed of a pressing plate 52a and a heating plate 52b disposed on the bottom of the pressing plate 52a. The lower side hot press plate 52 is supported by a support member 52c and can be moved in an up/down direction.

In addition, the upper side hot press plate 54 is formed of a pressing plate 54a and a heating plate 54b disposed on the pressing plate 54a. The upper side hot press plate 54 is supported by a support member 54c and can be moved in the up/down direction.

The pressing plates 52a and 54a of the lower side hot press plate 52 and the upper side hot press plate 54 are formed of metal plates made of stainless steel etc. In addition, heaters (not shown) including electrically heating wires or heating media, etc. are provided in the heating plates 52b and 54b of the lower side hot press plate 52 and the upper side hot press plate 54 so that a work can be heated by the heaters.

The aforementioned wiring member 3 in FIG. 9B is disposed between the lower side hot press plate 52 and the upper side hot press plate 54 of such a hot press device 50. Further, when the thermosetting epoxy resin is used as the material of the insulating layer 40, heating temperature of each of the heating plates 52b and 54b of the lower side hot press plate 52 and the upper side hot press plate 54 is set at 150° C. Here, the glass transition point of the thermosetting epoxy resin is 150° C.

Assume that the thermosetting resin once hardened is heated to the vicinity of the glass transition point (Tg). In this case, the thermosetting resin can be deformed easily when it is pressed mechanically.

Figure 11A:
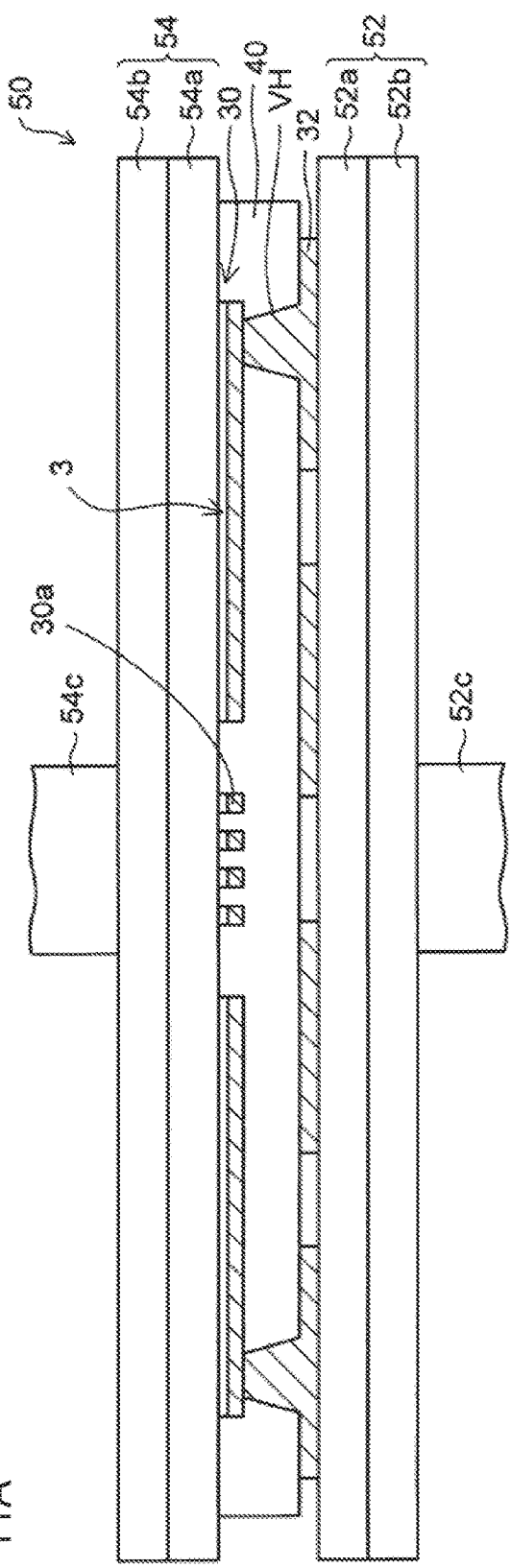
FIGS. 11A and 11B are sectional views (part 9) showing the method for manufacturing the wiring board according to the first embodiment.

Successively, as shown in FIG. 11A, the aforementioned wiring member 3 in FIG. 9B is pressed while heated by the lower side hot press plate 52 and the upper side hot press plate 54 of the hot press device 50. On this occasion, the wiring member 3 is pressed with the pressure which is given by the hot press device 50 and which is preferably set in the range of from 0.3 MPa to 1.0 MPa.

Figure 11B:
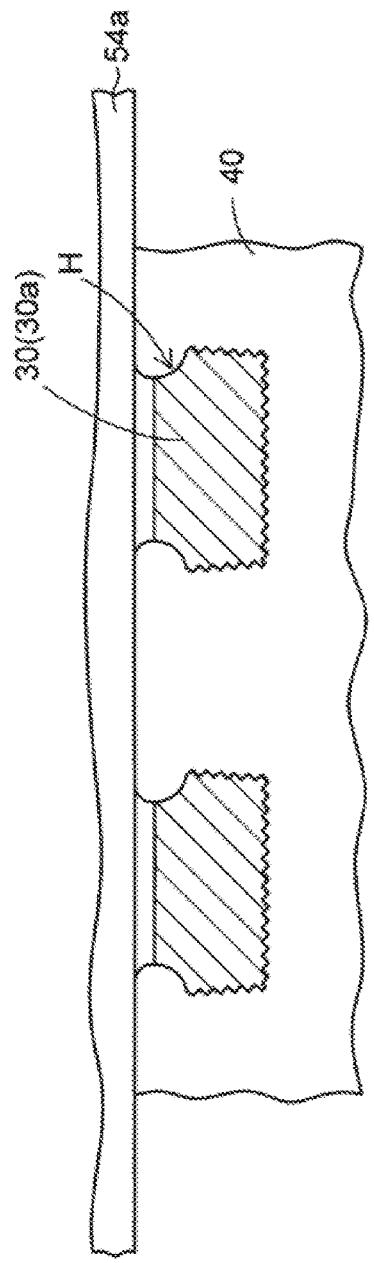

Thus, as shown in a partially enlarged sectional view of FIG. 11B, the insulating layer 40 on the outer side of the recess portion H in the outer edge portion of the first wiring layer 30 is pressed inward to be deformed by the upper side hot press plate 54.

Figure 12:
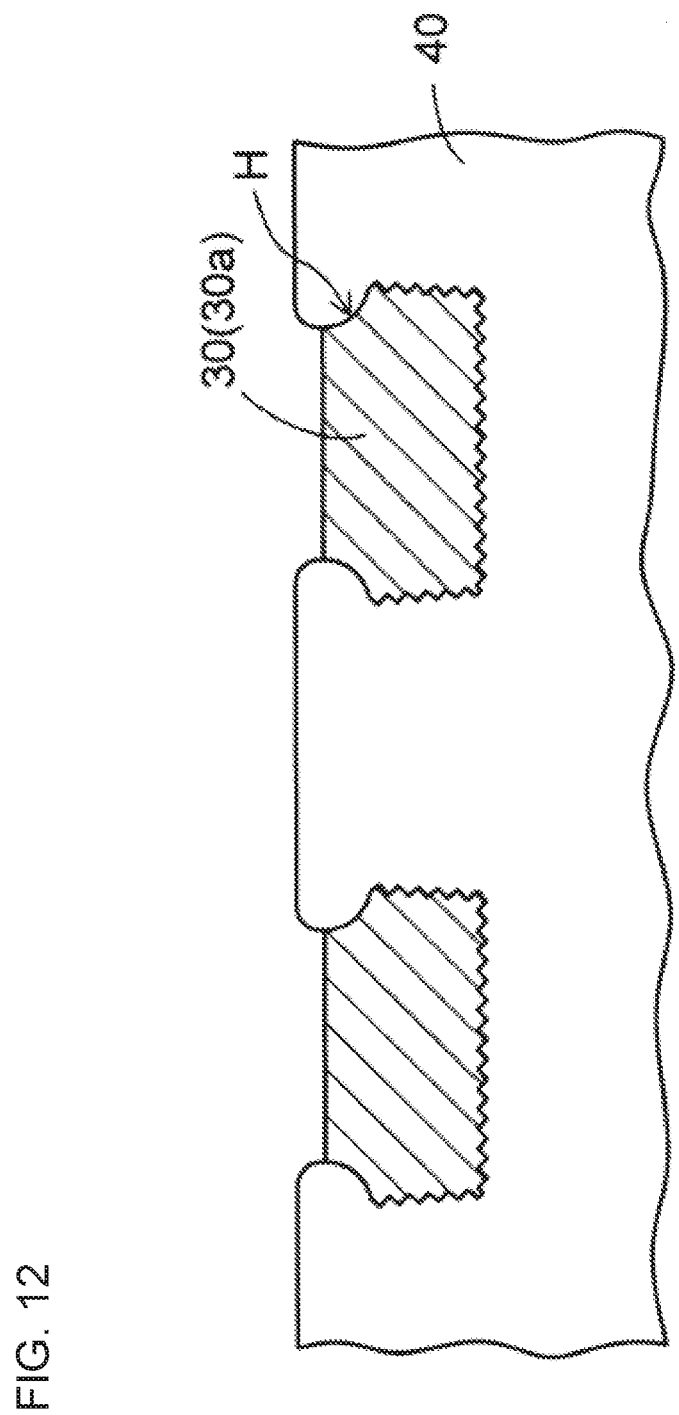
FIG. 12 is a sectional view (part 10) showing the method for manufacturing the wiring board according to the first embodiment.

Then, the hot press device 50 is removed from the wiring member 3. Thus, as shown in FIG. 12, the recess portion H in the outer edge portion of the first wiring layer 30 is fully filled with the insulating layer 40. Thus, the gap between the side surface of the recess portion H in the first wiring layer 30 and the insulating layer 40 can be eliminated. In addition, The recess portion H may not be fully filled with the insulating layer 40. For example, the recess portion H may be partially filled with the insulating layer 40.

Therefore, even when the sulfuric acid component stays behind in the recess portion H in the outer edge portion of the first wiring layer 30, the sulfuric acid component can be confined in the insulating layer 40 with which the recess portion H is filled.

Accordingly, the sulfuric acid component in the recess portion H in the outer edge portion of the first wiring layer 30 can hardly react with the atmospheric moisture content. Thus, the first wiring layer 30 can be prevented from being corroded by sulfate ions.

In addition, the sulfuric acid component staying behind in the recess portion H in the outer edge portion of the first wiring layer 30 is confined in the insulating layer 40. Accordingly, even when voltage is applied to the first wiring layer 30 under an environment containing a moisture content, a movement path of sulfate ions until they are exposed to the atmosphere can be elongated.

Therefore, ionic migration can hardly occur so that electric short-circuiting can be prevented from occurring among the wiring patterns of the first wiring layer 30. Thus, reliability of insulation properties of the insulating layer 40 disposed horizontally on the first wiring layer 30 can be secured.

Further, the recess portion H in the outer edge portion of the first wiring layer 30 is filled with the insulating layer 40. Accordingly, the outer edge portion of the first wiring layer 30 is retained by a coating portion of the insulating layer 40. Thus, the first wiring layer 30 can hardly drop off from the insulating layer 40.

In addition, the contact area between the first wiring layer 30 and the insulating layer 40 is larger than that in the case where the recess portion H in the first wiring layer 30 is exposed. Therefore, adhesion between the first wiring layer 30 and the insulating layer 40 can be improved.

Figure 13:
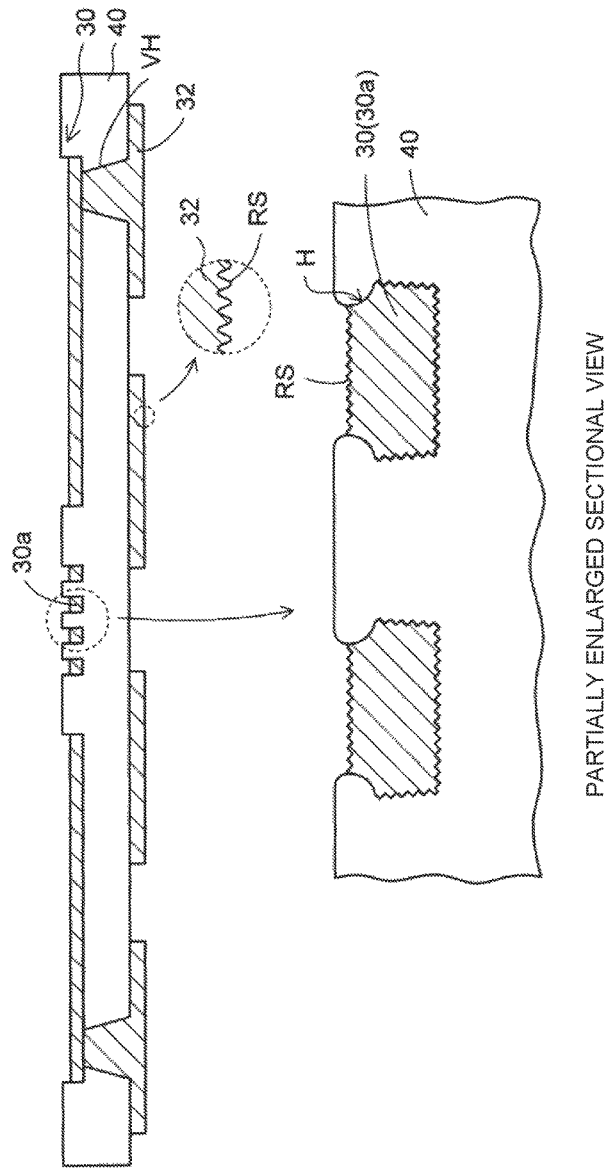
FIG. 13 is a sectional view (part 11) showing the method for manufacturing the wiring board according to the first embodiment.

Next, as shown in FIG. 13, the upper surface of the first wiring layer 30 and the lower and side surfaces of the second wiring layer 32 are formed into roughened surfaces RS by roughing treatment in a similar manner to the aforementioned step of FIG. 6. On this occasion, the inner surface of the recess portion H in the outer edge portion of the first wiring layer 30 is not roughened but left as a smooth surface as it is because the inner surface of the recess portion H is covered with the insulating layer 40.

Alternatively, the first wiring layer may be subjected to roughing treatment after the aforementioned second copper foil 22 in FIG. 9A is wet-etched to expose the first wiring layer. In this case, the inner surface of the recess portion H in the outer edge portion of the first wiring layer 30 is also formed into roughened surfaces.

Further, as shown in FIG. 14, a solder resist layer 42 is formed on an upper surface side of the insulating layer 40 so that an opening portion 42a can be collectively disposed in the electronic component mounting region R. On this occasion, due to the upper surface of the first wiring layer 30 which is a roughened surface RS, the solder resist layer 42 can be formed to have good adhesion to the first wiring layer 30.

In addition, a solder resist layer 44 is formed on a lower surface side of the insulating layer 40 so that opening portions 44a provided in the solder resist layer 44 can be disposed on connection portions of the second wiring layer 32. On this occasion, due to the lower surface of the second wiring layer 32 which is a roughened surface RS, the solder resist layer 44 can be formed to have good adhesion to the second wiring layer 32. Parts of the second wiring layer 32 exposed in the opening portions 44a of the solder resist layer 44 on the lower surface side serve as external connection pads P3.

After the step of FIG. 14, a surface treatment layer may be formed on the upper surface of the first wiring layer 30 exposed from the opening portion 42a of the solder resist layer 42 on the upper surface side if occasion demands. In addition, a surface treatment layer may be formed on the connection portions of the second wiring layer 32 exposed from the opening portions 44a of the solder resist layer 44 on the lower surface side if occasion demands.

A combination of a nickel layer/a gold layer or a nickel layer/a palladium layer/a gold layer formed by electroless plating in order from bottom to top, or an organic coating of an azole compound, an imidazole compound or the like formed by OSP (Organic Solderability Preservative) treatment may be used as the surface treatment layer.

In the aforementioned manner, it is possible to obtain the wiring board 1 according to the first embodiment. The wiring member is cut to obtain each product region, which serves as the wiring board 1.

As shown in FIG. 14, the wiring board 1 according to the first embodiment includes the insulating layer 40 having the electronic component mounting region R. The first wiring layer 30 is embedded in the insulating layer 40. The first wiring layer 30 is formed only of the copper plating layer 30x by electrolytic plating. Therefore, a seed layer is absent from the first wiring layer 30. While the upper surface of the first wiring layer 30 is exposed from the insulating layer 40, the side and lower surfaces of the first wiring layer 30 are embedded in the insulating layer 40.

The first wiring layer 30 includes the electronic component mounting pads P1 and the via receiving pads P2. In addition, the first wiring layer 30 is formed to include the fine wiring portions 30a which are disposed in the central portion of the electronic component mounting region R.

In addition, the upper, side and lower surfaces of the first wiring layer 30 are formed into roughened surfaces RS. The inner surface of the recess portion H in the outer edge portion of the upper surface of the first wiring layer 30 is a smooth surface smaller in surface roughness than the roughened surfaces RS.

No other member is formed on the upper surface of the first wiring layer 30. Terminals of an electronic component are connected to the upper surface of the first wiring layer 30. In the example of FIG. 14, the terminals of the electronic component are flip-chip connected to the electronic component mounting pads P1 of the first wiring layer 30.

The via holes VH are formed in the insulating layer 40 to reach the via receiving pads P2 of the first wiring layer 30. The second wiring layer 32 is formed on the lower surface of the insulating layer 40 to be connected to the first wiring layer 30 through the via conductors inside the via holes VH. The side and lower surfaces of the second wiring layer 32 are roughened surfaces (FIG. 13).

Further, the solder resist layer 42 is formed on the upper surface side of the insulating layer 40 so that the opening portion 42a provided in the solder resist layer 42 can be disposed in the electronic component mounting region R.

In addition, the solder resist layer 44 is formed on the lower surface side of the insulating layer 40 so that the opening portions 44a provided in the solder resist layer 44 can be disposed on the connection portions of the second wiring layer 32. The external connection pads P3 of the second wiring layer 32 are exposed in the opening portions 44a of the solder resist layer 44 on the lower surface side.

As described above, the wiring board 1 according to the first embodiment is manufactured by the method for manufacturing the coreless type wiring board. Therefore, when the second copper foil 22 is wet-etched after the temporary substrate 6 is removed, the recess portion H is formed to extend in the thickness direction from the outer edge portion of the upper surface of the first wiring layer 30.

Therefore, in a post step, the insulating layer 40 is deformed by hot press so that the recess portion H in the outer edge portion of the first wiring layer 30 can be filled and covered with the insulating layer 40.

Thus, even when the sulfuric acid component of the etchant for the second copper foil 22 stays behind in the recess portion H in the first wiring layer 30, the sulfuric acid component can hardly react with a moisture content so that the first wiring layer 30 can be prevented from being corroded by sulfate ions.

In addition, even when voltage is applied to the first wiring layer 30 under an environment containing a moisture content, a movement path of sulfate ions until they are exposed to the atmosphere can be elongated. Thus, ionic migration can hardly occur so that electronic short-circuiting can be prevented from occurring among the wiring patterns of the first wiring layer 30.

Further, the outer edge portion of the first wiring layer 30 is retained by the coating portion of the insulating layer 40. Accordingly, the first wiring layer 30 can hardly drop off from the insulating layer 40.

In addition, the first wiring layer 30 is etched slightly when the second copper foil 22 is wet-etched. Therefore, the height of the upper surface of the first wiring layer 30 is lower than the height of the upper surface of the insulating layer 40.

Next, a method for constructing the electronic component device by use of the aforementioned wiring board 1 in FIG. 14 will be described.

As shown in FIG. 15, a semiconductor chip 60 having terminals 62 on the lower surface thereof is prepared as an electronic component. The terminals 62 of the semiconductor chip 60 include solder bumps or gold bumps etc. The terminals 62 of the semiconductor chip 60 are flip-chip connected to the electronic component mounting pads P1 of the first wiring layer 30 of the wiring board 1 through solders (not shown).

Then, a space between the semiconductor chip 60 and the wiring board 1 is filled with an underfill resin 64.

As described above, the electronic component device 2 according to the first embodiment can be obtained. Since the aforementioned wiring board 1 is used in the electronic component device 2, it is possible to secure satisfactory reliability of the electronic component device.

In addition, even when tensile load is applied to pull the semiconductor chip 60 upward, the first wiring layer 30 can be prevented from dropping off from the insulating layer 40 because the recess portion H in the first wiring layer 30 of the wiring board 1 is retained by the insulating layer 40.

Although the semiconductor chip is illustrated as the electronic component in the aforementioned embodiment, it is possible to mount any of various electronic components which can be selected from a capacitor element, a resistance element, an inductor element, etc.

Second Embodiment

FIGS. 16A and 16B, FIGS. 17A and 17B and FIG. 18 are views showing a method for manufacturing a wiring board according to a second embodiment. FIG. 19 is a view showing the wiring board according to the second embodiment.

The aforementioned wiring board 1 according to the first embodiment uses a multilayer wiring structure in which the first wiring layer 30 is formed on one surface of the insulating layer 40 and the second wiring layer 32 is formed on the other surface of the insulating layer 40.

The wiring board according to the second embodiment uses a single-layer wiring structure in which a wiring layer is formed only on one surface of an insulating layer.

In the method for manufacturing the wiring board according to the second embodiment, first, the same steps as the aforementioned steps of FIG. 3A to FIG. 7B performed in the first embodiment are carried out. Thus, a structure substantially the same as the aforementioned structure shown in FIG. 7B is obtained, as shown in FIG. 16A.

In the second embodiment, the aforementioned first wiring layer 30 in FIG. 7B is replaced by a wiring layer 34, as shown in FIG. 16A. The wiring layer 34 is disposed to have the same layout as that of the aforementioned first wiring layer 30 shown in the partially plan view of FIG. 5.

The wiring layer 34 is formed to include fine wiring portions 34a, and electronic component mounting pads P1 with external connection pads P3. In the second embodiment, the aforementioned via receiving pads P2 in FIG. 7B are replaced by the external connection pads P3.

The via holes VH formed in the aforementioned insulating layer 40 in FIG. 7B are formed as opening portions 40a which expose the external connection pads P3. For example, each of the opening portions 40a of the insulating layer 40 is formed into a circular truncated cone shape whose diameter on an opening end side is larger than the diameter of its own bottom on the wiring layer 34 side.

Next, as shown in FIG. 16B, a first copper foil 20 of a temporary substrate 6 is released from a second copper foil 22 at an interface between the both in a similar manner to the aforementioned step of FIG. 8B performed in the first embodiment. Accordingly, the temporary substrate 6 is separated from the second copper foil 22.

Next, a state in which the structure of FIG. 16B has been turned upside down is shown in FIG. 17A. As shown in FIGS. 17A and 17B the second copper foil 22 is removed by wet etching from the structure of FIG. 17A by a similar method to the aforementioned step of FIGS. 9A and 9B.

Thus, as shown in FIG. 17B, an upper surface of the wiring layer 34 and an upper surface of the insulating layer 40 are exposed. As shown in a partially enlarged sectional view of FIG. 17B, recess portions H are formed as fine gaps in outer edge portions of fine wiring portions 34a of the wiring layer 34, similarly to the aforementioned FIG. 9B.

Similarly, recess portions H are also formed as fine gaps in outer edge portions of the wiring layer 34 including the electronic component mounting pads P1 and the external connection pads P3.

Figure 18:
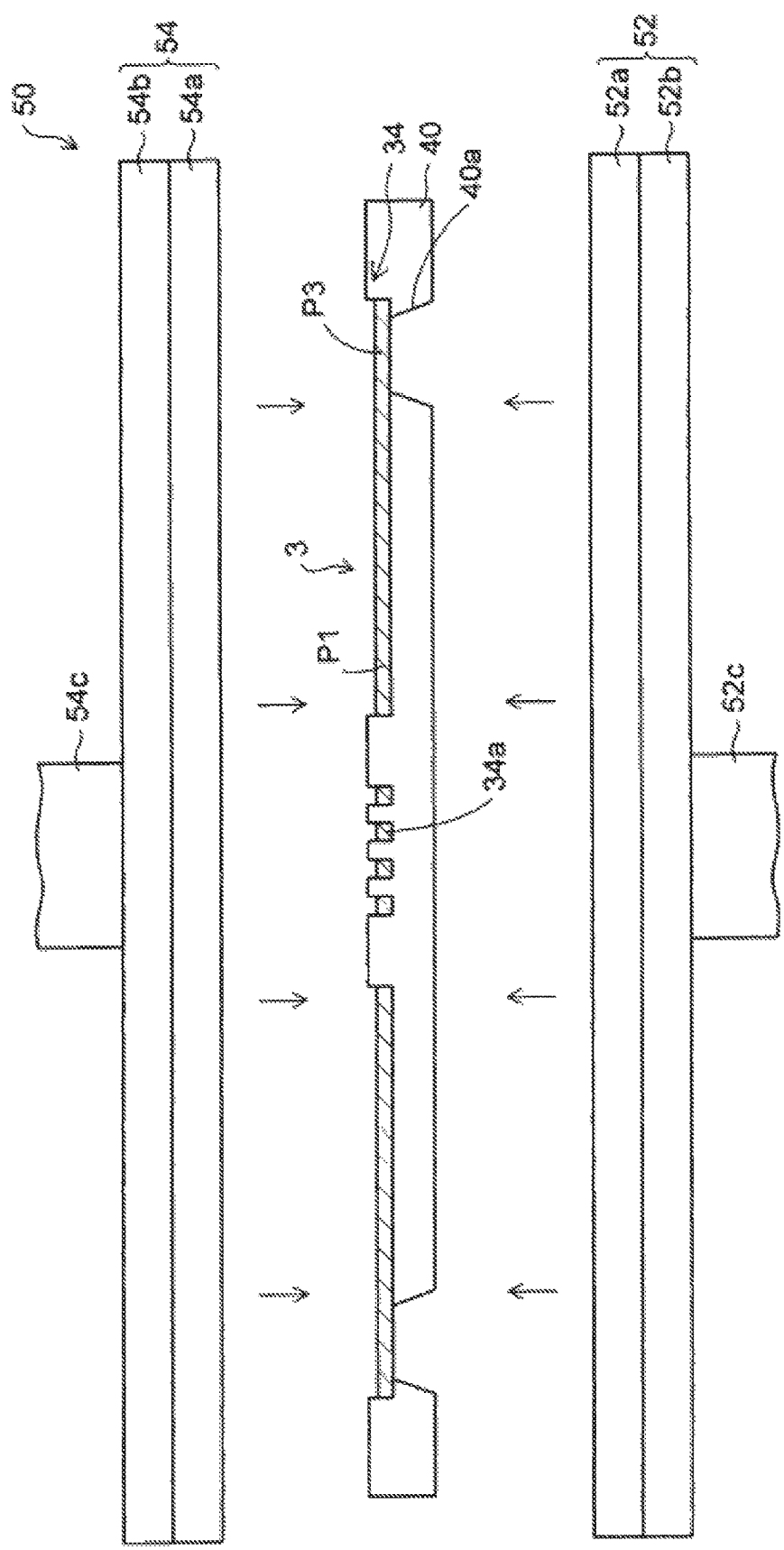
FIG. 18 is a sectional view (part 3) showing the method for manufacturing the wiring board according to the second embodiment.

Next, as shown in FIG. 18, the structure of FIG. 17B is pressed while heated by a lower side hot press plate 52 and an upper side hot press plate 54 of a hot press device 50 by a similar method to the aforementioned step of FIG. 10 and FIGS. 11A and 11B.

Thus, as shown in a partially enlarged sectional view of FIG. 19, the recess portions H in the outer edge portions of the fine wiring portions 34a of the wiring layer 34 are embedded in the insulating layer 40. Accordingly, the gaps between side surfaces of the recess portions H in the fine wiring portions 34a and the insulating layer 40 are filled. Further, in the second embodiment, peripheral edge portions PE in upper surfaces of the fine wiring portions 34a are covered with the insulating layer 40.

Similarly, the recess portions H in the outer edge portions of the wiring layer 34 including the electronic component mounting pads P1 and the external connection pads P3 are also embedded in the insulating layer 40, and peripheral edge portions PE in the upper surface of the wiring layer 34 are covered with the insulating layer 40.

By adjustment of pressing conditions of the hot press device 50, the insulating layer 40 can be deformed so that the peripheral edge portions PE in the upper surface of the wiring layer 34 on the inner sides can be covered with the insulating layer 40 from the recess portions H in the wiring layer 34.

Thus, the recess portions H in the outer edge portions of the wiring layer 34 are embedded in the insulating layer 40, and the peripheral edge portions PE in the exposed surface of the wiring layer 34 exposed from the insulating layer 40 are covered with the insulating layer 40.

Further, surface treatment such as OSP treatment is applied to the upper surface of the wiring layer 34 exposed on the upper surface side of the insulating layer 40 and lower surfaces of the external connection pads P3 exposed in the opening portions 40a of the insulating layer 40.

In the aforementioned manner, a wiring board 1a according to the second embodiment is obtained, as shown in FIG. 19.

As shown in FIG. 19, the wiring board 1a according to the second embodiment has a single-layer wiring structure in which the wiring layer 34 is formed only on the upper surface of the insulating layer 40 because the second wiring layer 32 is removed from the wiring board 1 shown in FIG. 14 according to the first embodiment.

In FIG. 19, the aforementioned first wiring layer 30 in FIG. 14 is replaced by the wiring layer 34, and the via receiving pads P2 in FIG. 14 are replaced by the external connection pads P3. The opening portions 40a which expose the lower surface of the wiring layer 34 are formed in a lower surface of the insulating layer 40, and portions of the lower surface of the wiring layer 34 which are exposed in the opening portions 40a are the external connection pads P3.

A solder resist layer for collectively exposing an electronic component mounting region R may be formed on the upper surface of the insulating layer 40, similarly to FIG. 14 in the first embodiment.

Differently from the wiring board 1 according to the first embodiment, the wiring board 1a according to the second embodiment has only one wiring layer 34 formed on one insulating layer 40. Accordingly, the wiring layer 34 is not connected to another wiring layer under the insulating layer 40 through via conductors. Therefore, there is likelihood that the wiring layer 34 may be peeled from the insulating layer 40.

In the wiring board 1a according to the second embodiment, the recess portions H in the outer edge portions of the wiring layer 34 are embedded in the insulating layer 40. Further, the peripheral edge portions PE in the upper surface of the wiring layer 34 are covered with the insulating layer 40. In plan view, the insulating layer 40 is disposed to be connected to the peripheral edge portions PE so that the peripheral edge portions PIE along an outer circumference of a pattern of the wiring layer 34 can be pressed by the insulating layer 40. A central portion of the pattern of the wiring layer 34 is exposed from the insulating layer 40.

With the structure made thus, the peripheral edge portions PE in the upper surface of the wiring layer 34 are supported and fixed by the insulating layer 40. Accordingly, adhesive force of the wiring layer 34 is improved so that the wiring layer 34 can be prevented from being peeled from the insulating layer 40.

In addition, a movement path of a sulfuric acid component staying behind in the recess portions H in the outer edge portions of the wiring layer 34 until the sulfuric acid is exposed to the atmosphere can be made longer than that in the structure according to the first embodiment. Therefore, it is possible to improve an effect that occurrence of ion migration is prevented. Accordingly, it is possible to further improve reliability of insulation properties of the insulating layer 40.

The wiring board 1a according to the second embodiment obtains a similar effect to the wiring board 1 shown in FIG. 14 according to the first embodiment.

Third Embodiment

FIGS. 20A and 20B, FIGS. 21A and 21B and FIG. 2.2 are views showing a method for manufacturing a wiring board according to a third embodiment. FIG. 23 is a view showing the wiring board according to the third embodiment.

In the method for manufacturing the wiring board according to the third embodiment, the aforementioned steps of FIG. 3A to FIG. 7B performed in the first embodiment are carried out similarly to the second embodiment. Thus, the same structure as the aforementioned structure shown in FIG. 16A according to the second embodiment is obtained, as shown in FIG. 20A.

As shown in FIG. 20A, in the third embodiment, the via holes NTH formed in the insulating layer 40 in FIG. 7B are formed as opening portions 40a similarly to the second embodiment. The opening portions 40a expose external connection pads P3. Further, surface treatment such as OSP treatment is applied to the external connection pads P3 which are exposed in the opening portions 40a of the insulating layer 40.

Next, as shown in FIG. 20B, a carrier 70 is bonded and laminated on the insulating layer 40 of the structure of FIG. 20A, through an adhesive layer 72. For example, a metal foil such as a copper foil, a resin film such as a polyimide film, or a resin substrate made of a glass fiber cloth-containing epoxy resin etc is used as the carrier 70.

A resin such as an acrylic resin, a silicone resin or an epoxy resin is used as the material of the adhesive layer 72.

Figure 21A:
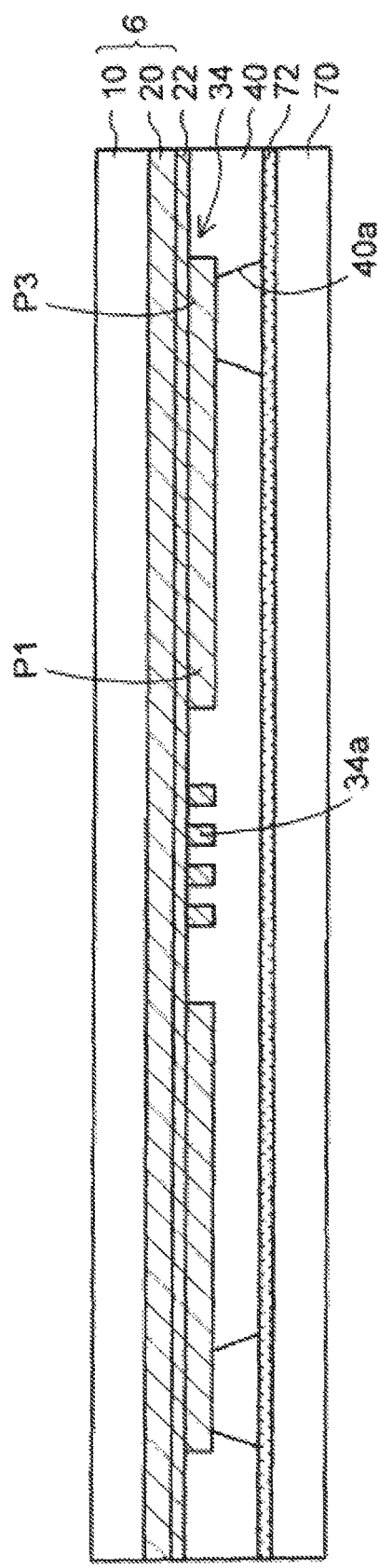
FIGS. 21A and 21B are sectional views (part 2) showing the method for manufacturing the wiring board according to the third embodiment.
Figure 21B:
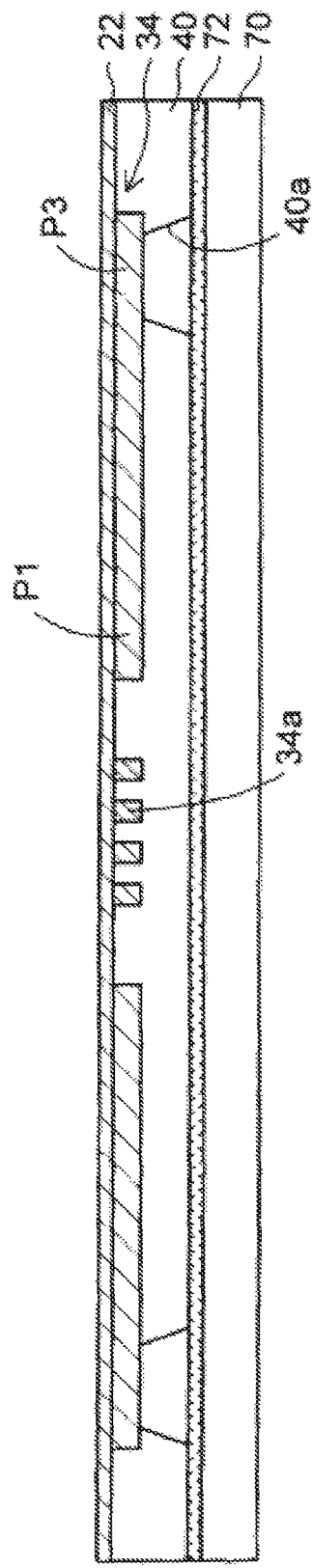

Next, a state in which the structure of FIG. 20B has been turned upside down is shown in FIG. 21A. As shown in FIG. 21B, a first copper foil 20 of a temporary substrate 6 is released from a second copper foil 22 at an interface between the both in a similar manner to the aforementioned step of FIGS. 8A and 8B. Accordingly, the temporary substrate 6 is separated from the second copper foil 22.

Successively, as shown in FIG. 22, the second copper foil 22 is removed by wet etching from the structure of FIG. 21B by a similar method to the aforementioned step of FIGS. 9A and 9B.

Thus, as shown in FIG. 22, an upper surface of a wiring layer 34 and an upper surface of the insulating layer 40 are exposed. As shown in a partially enlarged sectional view of FIG. 22, recess portions H are formed as fine gaps in outer edge portions of fine wiring portions 34a of the wiring layer 34 similarly to the aforementioned FIG. 17B. Similarly, recess portions H are also formed as fine gaps in outer edge portions of the wiring layer 34 including electronic component mounting pads P1 and external connection pads P3.

Next, as shown in FIG. 23, the structure of FIG. 22 is pressed while heated by a lower side hot press plate 52 and an upper side hot press plate 54 of a hot press device 50 (not shown in the third embodiment) by a similar method to the aforementioned step of FIG. 10 and FIGS. 11A and 11B.

Thus, as shown in a partially enlarged sectional view of FIG. 23, the recess portions H in the outer edge portions of the fine wiring portions 34a of the wiring layer 34 are embedded in the insulating layer 40. Further, peripheral edge portions PE in the upper surface of the wiring layer 34 are covered with the insulating layer 40.

Similarly, the recess portions H in the outer edge portions of the wiring layer 34 including the electronic component mounting pads P1 and the external connection pads P3 are also embedded in the insulating layer 40, and the peripheral edge portions PE in the upper surface of the wiring layer 34 are covered with the insulating layer 40.

Then, surface treatment such as OSP treatment is applied to the upper surface of the wiring layer 34 which is exposed from the upper surface of the insulating layer 40.

Thus, a wiring board 1b according to the third embodiment is obtained, as shown in FIG. 23.

As shown in FIG. 23, the wiring board 1b according to the third embodiment is formed in such a manner that the carrier 70 is bonded on a lower surface of the insulating layer 40 in the wiring board 1a shown in FIG. 19 according to the second embodiment, through the adhesive layer 72. In FIG. 23, all the members except the carrier 70 bonded thus are the same as those in the wiring board 1a shown in FIG. 19 according to the second embodiment.

A body portion of the wiring board 1b excluding the carrier 70 according to the third embodiment is a thin type wiring board in which a lower surface and a side surface of one wiring layer 34 are embedded in one insulating layer 40. Due to the lamination of the carrier 70 on such a thin type wiring board, sufficient strength can be secured.

Therefore, handling can be easy when the wiring board 1b is conveyed or when a semiconductor chip is mounted on the wiring board 1b.

Next, a method for mounting a semiconductor chip on the wiring board 1b shown in FIG. 23 will be described.

Figure 24:
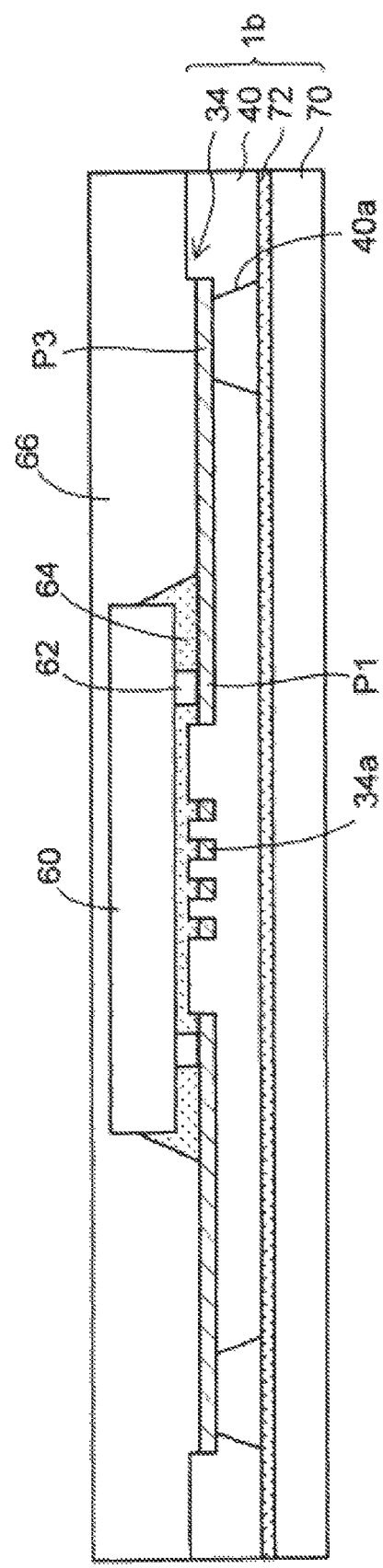
FIG. 24 is a sectional view showing a method for manufacturing an electronic component device by use of the wiring board in FIG. 23.

As shown in FIG. 24, a semiconductor chip 60 provided with terminals 62 in its lower surface is prepared as an electronic component. The terminals 62 of the semiconductor chip 60 are flip-chip connected to the electronic component mounting pads P1 of the wiring layer 34 of the wiring board 1b through solder (not shown).

Then, an underfill resin 64 is filled between the semiconductor chip 60 and the wiring board 1b. Further, an encapsulation resin 66 for covering the semiconductor chip 60 and the upper surface of the wiring board 1b is formed. The encapsulation resin 66 is formed, for example, by transfer molding an epoxy resin.

The encapsulation resin 66 may be formed so that the back of the semiconductor chip 60 can be exposed from the encapsulation resin 66.

Due to the encapsulation resin 66 formed thus, strength of an electronic component device 2a from which the carrier 70 has been released can be secured, as will be described later.

On this occasion, the wiring board 1b is provided with the carrier 70 to have sufficient strength. Accordingly, mounting of the semiconductor chip 60 or formation of the underfill resin 64 and the encapsulation resin 66 on the wiring board 1b can be carried out reliably.

Incidentally, when sealing of the semiconductor chip 60 or reinforcement of the electronic component device 2a from which the carrier 70 has been released is not necessary, the encapsulation resin 66 can be dispensed with.

Figure 25:
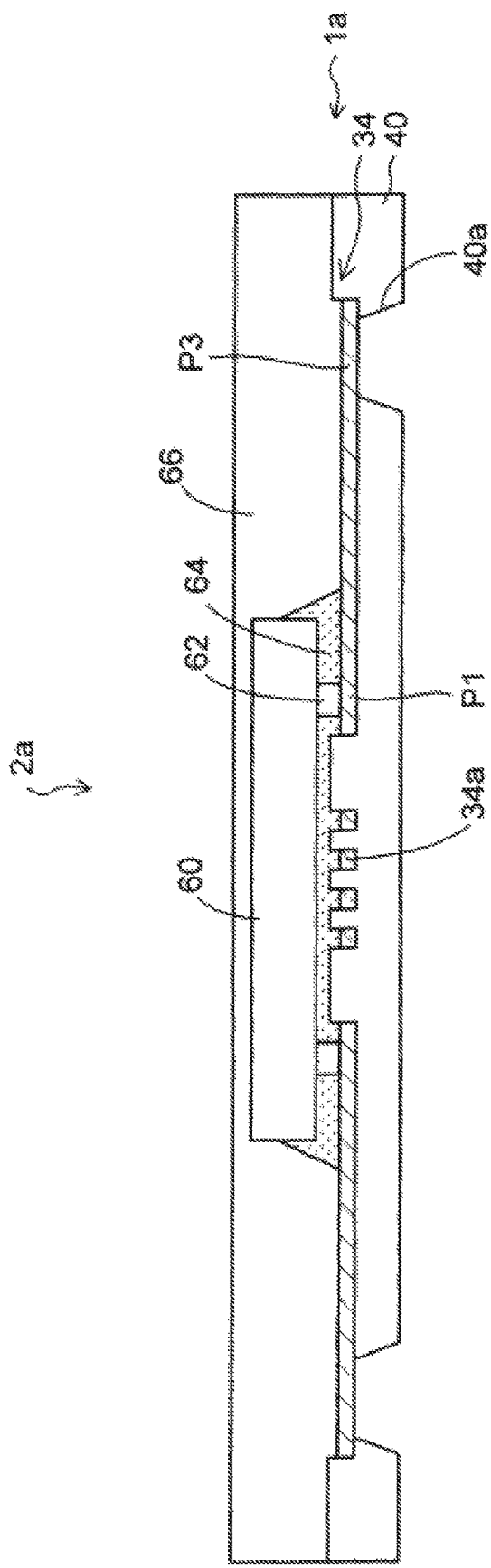
FIG. 25 is a sectional view (part 1) showing the electronic component device according to the third embodiment.

Next, as shown in FIG. 25, the adhesive layer 72 is pulled off from the lower surface of the insulating layer 40 of the wiring board 1b so as to release the carrier 70. Thus, the wiring board 1b becomes a wiring board 1a having the same structure as that shown in FIG. 19 according to the second embodiment.

In the aforementioned manner, the electronic component device 2a according to the third embodiment is obtained, as shown in FIG. 25. Even after the carrier 70 is released, sufficient strength can be obtained in the electronic component device 2a due to the presence of the encapsulation resin 66.

Figure 26:
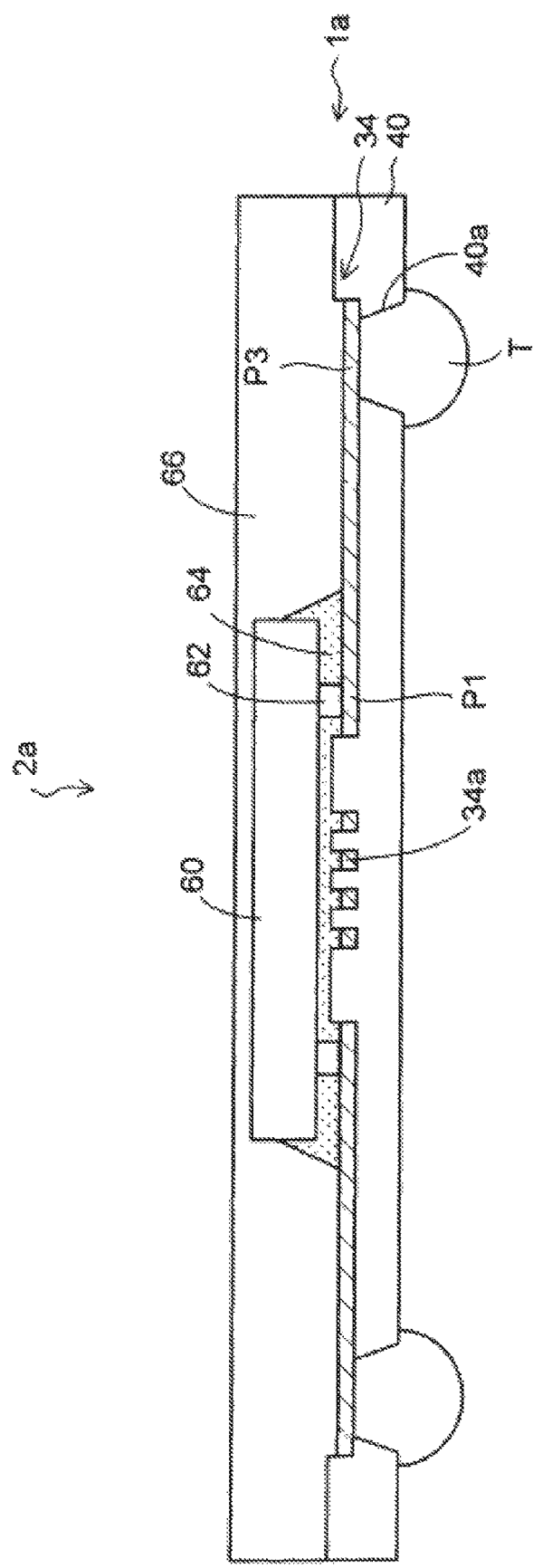
FIG. 26 is a sectional view (part 2) showing the electronic component device according to the third embodiment.

As shown in FIG. 26, external connection terminals T may be mounted, for example, as solder balls on the external connection pads P3 inside the opening portions 40a of the insulating layer 40.

In the aforementioned manner, the carrier 70 is laminated on the wiring board to thereby reinforce the strength of the board in the third embodiment. Therefore, the productivity and yield for constructing the electronic component device can be improved even when a thin type wiring board having a single-layer wiring structure is used.

When the semiconductor chip 60 is mounted on the aforementioned wiring board 1a shown in FIG. 19 according to the second embodiment, an electronic component device obtained thus has a similar form to that shown in FIGS. 25 and 26.

Fourth Embodiment

Figure 27:
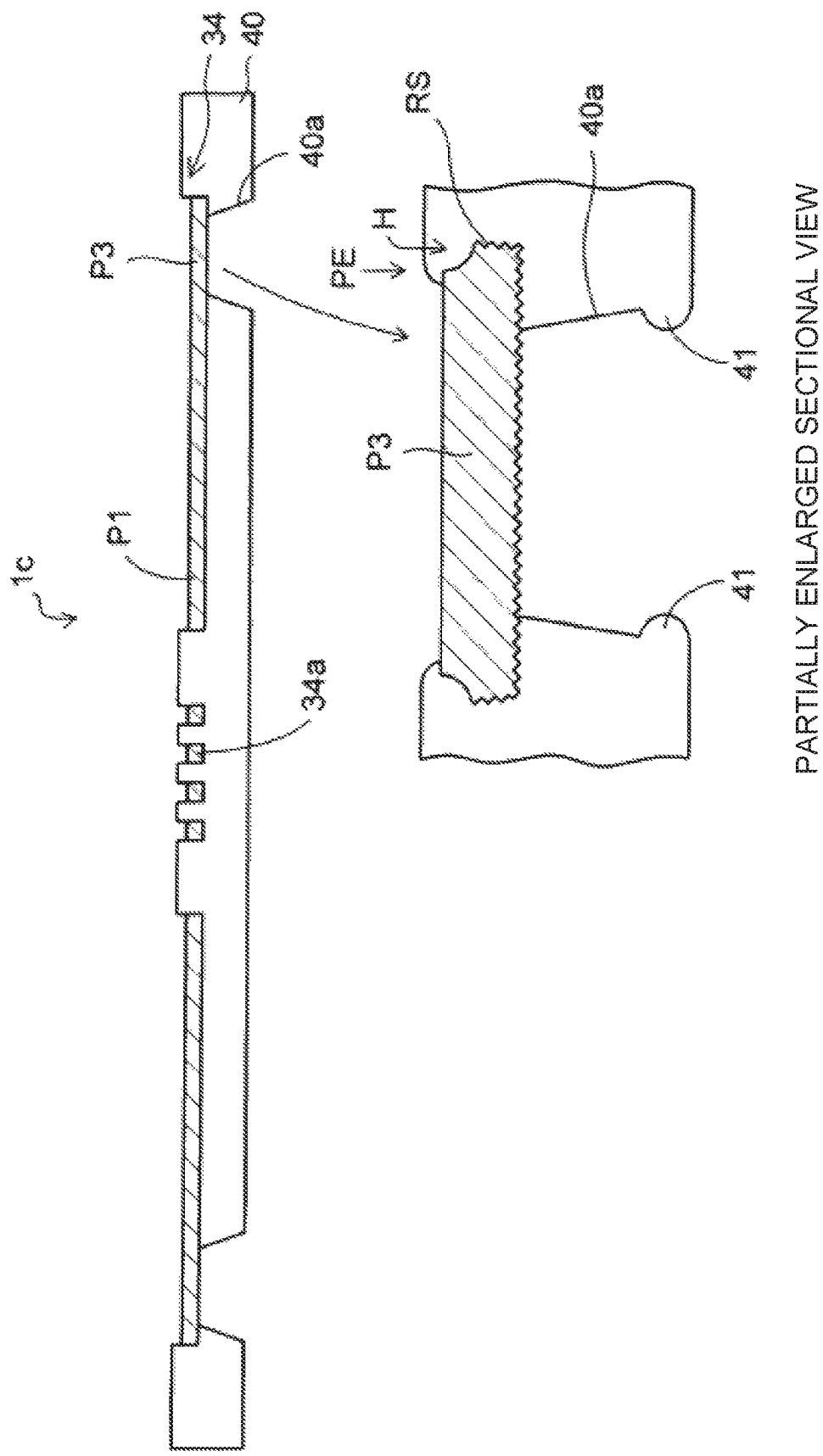
FIG. 27 is a sectional view showing a wiring board according to a fourth embodiment.

FIG. 27 is a showing a wiring board according to a fourth embodiment. As shown in FIG. 27, protrusion portions 41 are formed in front end portions of inner walls of opening portions 40a of an insulating layer 40 in a wiring board 1c according to the fourth embodiment so as to protrude inward from the opening portions 40a.

For example, each of the opening portions 40a of the insulating layer 40 is formed into a circular shape in plan view. The protrusion portions 41 each formed into a ring shape are disposed on opening ends of the opening portions 40a of the insulating layer 40.

When the insulating layer 40 is pressed while heated by a hot press device 50 in the aforementioned step of FIGS. 18 and 19 in the second embodiment, the opening ends of the opening portions 40a of the insulating layer 40 are crushed and deformed so that the protrusion portions 41 can be formed simultaneously.

In the embodiment, the protrusion portions 41 protruding inward are formed in the front end portions of the inner walls of the opening portions 40a of the insulating layer 40. Thus, when external connection terminals T are formed as solder balls etc. in the opening portions 40a of the insulating layer 40 as in the aforementioned FIG. 26, bonding strength of the external connection terminals T can be improved by an anchor effect attained by the protrusion portions 41.

As described above, the exemplary embodiment and the modification are described in detail. However, the present invention is not limited to the above-described embodiment and the modification, and various modifications and replacements are applied to the above-described embodiment and the modifications without departing from the scope of claims.

The present disclosure will be summarized as follows.

According to the present disclosure, in the wiring board, the wiring layer is embedded in the insulating layer. The side and lower surfaces of the wiring layer are embedded in the insulating layer while the upper surface of the wiring layer is exposed from the insulating layer. The recess portion is formed in the outer edge portion of the upper surface of the wiring layer. The recess portion is filled with the insulating layer.

The wiring board is manufactured by the method for manufacturing a coreless type wiring board. Accordingly, the recess portion is formed in the outer edge portion of the finally exposed wiring layer.

The recess portion in the outer edge portion of the wiring layer is filled with the insulating layer. Accordingly, even when a sulfuric acid component of an etchant stays behind in the recess portion, the sulfuric acid component is confined in the insulating layer with which the recess portion is filled.

Thus, the sulfuric acid component can hardly react with an atmospheric moisture content so that the wiring layer can be prevented from being corroded by sulfate ions or ionic migration can be prevented from occurring.

Further, the recess portion in the outer edge portion of the wiring layer is retained by a coating portion of the insulating layer. Accordingly, the wiring layer can hardly drop off from the insulating layer.

Various aspects of the subject matter described herein are set out non-exhaustively in the following numbered clauses:

1) A method of manufacturing a wiring board, comprising:

a) preparing a layered substrate comprising a temporary substrate and a metal foil formed on the temporary substrate, wherein the metal foil is removable from the temporary substrate;

b) forming a wiring layer on the metal foil;

c) roughing lower and side surfaces of the wiring layer;

d) forming an insulating layer on the metal foil and the wiring layer;

e) removing the temporary substrate from the metal foil;

f) wet-etching the metal foil to expose an upper surface of the wiring layer from the metal foil and form a recess portion in an outer edge portion of the upper surface of the wiring layer; and g) filling the recess portion of the wiring layer with the insulating layer.

2) The method according to clause (1), wherein the step (b) comprises:

b1) forming a plating resist layer with an opening portion on the metal foil;

b2) forming a metal plating layer in the opening portion of the plating resist layer by electrolytic plating using the metal foil as a plating power feed passage; and b3) removing the plating resist layer.

3) The method according to clause (1), wherein
the metal foil and the wiring layer are made of copper; and
a mixture solution of sulfuric acid and hydrogen peroxide water is used as an etchant in the step (f).

4) The method according to clause (1), wherein
the insulating layer is made of a thermosetting resin; and
the step (g) comprises filling the recess portion of the outer edge portion of the wiring layer with the insulating y by deforming the insulating layer through a hot press 5) The method according to clause (1); wherein in the step (b), the wiring layer comprises a pad configured to be connected to a terminal of an electronic component.

6) The method according to clause (1), wherein
the step (g) comprises filling the recess portion of the wiring layer with the insulating layer such that a peripheral edge portion of the upper surface of the wiring layer is covered with the insulating layer.

7) The method according to clause (1), further comprising:

h) forming an opening portion in the insulating layer such that the opening portion reaches the wiring layer,
wherein a portion of the wiring layer, which is exposed through the opening portion, is configured as an external connection pad.

What is claimed is:

1. A wiring board comprising:
an insulating layer; and
a wiring layer comprising: an upper surface; a lower surface opposite to the upper surface; and a side surface between the upper surface and the lower surface, wherein the upper surface of the wiring layer is exposed from the insulating layer, and the side surface and the lower surface of the wiring layer are embedded in the insulating layer,
wherein a recess portion is formed in an outer edge portion of the upper surface of the wiring layer, and
the recess portion is filled with the insulating layer.

2. The wiring board according to claim 1, wherein the height of the upper surface of the wiring layer is lower than that of an upper surface of the insulating layer.

3. The wiring board according to claim 1, wherein the wiring layer consists of an electrolytic metal plating layer, and the side surface and lower surface of the wiring layer are roughened.

4. The wiring board according to claim 1, wherein
the wiring layer further comprises a pad configured to be connected to a terminal of an electronic component.

5. The wiring board according to claim 1, wherein the recess portion is fully filled with the insulating layer.

6. The wiring board according to claim 1, wherein the recess portion is formed in the whole of the outer edge portion of the upper surface of the wiring layer.

7. The wiring board according to claim 1, wherein a peripheral edge portion of the upper surface of the wiring layer is covered with the insulating layer.

8. The wiring board according to claim 1, wherein an opening portion is formed in a lower surface of the insulating layer such that a portion of the lower surface of the wiring layer is exposed through the opening portion, and the exposed portion of the lower surface of the wiring layer is configured as an external connection pad.

9. An electronic component device comprising:
the wiring board according to claim 1; and
an electronic component having a terminal, wherein the terminal is connected to the upper surface of the wiring layer of the wiring board.

* * * * *